(12) United States Patent
Matsuzaki et al.

(10) Patent No.: US 7,195,980 B2
(45) Date of Patent: Mar. 27, 2007

(54) SEMICONDUCTOR DEVICE EXHIBITING A HIGH BREAKDOWN VOLTAGE AND THE METHOD OF MANUFACTURING THE SAME

(75) Inventors: Kazuo Matsuzaki, Nagano (JP); Naoto Fujishima, Nagano (JP); Akio Kitamura, Nagano (JP); Gen Tada, Nagano (JP); Masaru Saito, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 11/030,432

(22) Filed: Jan. 6, 2005

(65) Prior Publication Data
US 2005/0127439 A1    Jun. 16, 2005

Related U.S. Application Data

(62) Division of application No. 09/756,686, filed on Jan. 9, 2001, now Pat. No. 6,853,034.

(30) Foreign Application Priority Data
Jan. 18, 2000  (JP) .............................. 2000-008961
May 18, 2000  (JP) .............................. 2000-146704

(51) Int. Cl.
H01L 21/336  (2006.01)
(52) U.S. Cl. ...................... 438/286; 438/289
(58) Field of Classification Search ............... 438/284, 438/286, 289, 527; 257/343, 409, 492–493
See application file for complete search history.

(56) References Cited

U.S. PATENT DOCUMENTS 5,432,370 A    7/1995  Kitamura et al. ........... 257/339

(Continued)

FOREIGN PATENT DOCUMENTS
JP    6-120510    4/1994

OTHER PUBLICATIONS

"Lowered on-state resistance of lateral power MOSFET wtih high withstand voltage for Intelligent Power Device"; Uno et al.; The Institute of Electrical Engineers of Japan; EDD-93-21,SPC-93-43; pp. 21-29; Oct. 7, 1993.

Primary Examiner—Theresa T. Doan
(74) Attorney, Agent, or Firm—Rossi, Kimms & McDowell LLP

(57) ABSTRACT

The invention provides a semiconductor device exhibiting a stable and high breakdown voltage, which is manufactured at a low manufacturing cost. The semiconductor device of the invention includes an n-type silicon substrate; a p-type base region in the surface portion of substrate; an n-type drain region in the surface portion of n-type substrate; a p-type offset region in the surface portion of n-type substrate; an n-type source region in the surface portion of p-type base region; a p-type contact region in the surface portion of p-type base region; a gate electrode above the extended portion of p-type base region extending between n-type source region and n-type substrate (or p-type offset region), with a gate insulation film interposed therebetween; an insulation film on gate electrode and p-type offset region; a source electrode on n-type source region; and a drain electrode on n-type drain region. The p-type offset region is formed of a first p-type sub-region, a second p-type sub-region, and a third p-type sub-region.

9 Claims, 12 Drawing Sheets

U.S. PATENT DOCUMENTS 5,510,643 A * 4/1996 Kariyama .................. 257/409
5,705,842 A    1/1998 Kitamura et al. ........... 257/343
6,069,396 A    5/2000 Funaki ...................... 257/492
6,614,089 B2   9/2003 Nakamura et al. .......... 257/492
6,946,705 B2 * 9/2005 Kitaguchi .................. 257/335

* cited by examiner

LATERAL DISTANCE OF THE OFFSET REGION

US 7,195,980 B2

SEMICONDUCTOR DEVICE EXHIBITING A HIGH BREAKDOWN VOLTAGE AND THE METHOD OF MANUFACTURING THE SAME

CROSS REFERENCE TO RELATED APPLICATION

This application is a divisional application of U.S. application Ser. No. 09/756,686 filed on Jan. 9, 2001 now U.S. Pat. No. 6,853,034.

FIELD OF THE INVENTION

The present invention relates to lateral semiconductor devices exhibiting a high breakdown voltage used in high-breakdown-voltage power IC's for switching power supplies, for driving motors, or for driving inverters for fluorescent lamps.

BACKGROUND

Recently, PWM (pulse width modulation) has been widely used for controlling switching power supplies, for driving motors and for driving inverters for fluorescent lamps. In association with this, PWM control circuits that exhibit excellent performance, are small in size, are manufactured at reduced cost, are very reliable and consume less electric power, are highly desirable. To meet these conditions, there is an increased need for power IC's, in which are integrated power semiconductor devices exhibiting a high breakdown voltage. Since the power IC's drive the transformer in a power supply of 100 V or 200 V, it is highly desirable for the semiconductor devices in the power IC to exhibit a breakdown voltage of 700 V. To integrate the semiconductor devices easily with their control means, it is necessary to employ lateral semiconductor devices, the substrate and the drift region of which are highly resistive (lightly doped), as disclosed in The Institute of Electronic Engineers of Japan, EDD-93-21, 21-29 (1993) and U.S. Pat. No. 5,452,370.

FIG. 21 is a cross-sectional view of a conventional semiconductor device exhibiting a high breakdown voltage. Referring to FIG. 21, an n-type well region 172 is formed in a p-type substrate 171 with high resistivity of around 150 ohm-cm. A p-type base region 173 is formed in n-type well region 172. The surface impurity concentration (hereinafter referred to as the "surface concentration") in n-type well region 172 is $3 \times 10^{16}$ cm$^{-3}$, and the diffusion depth of n-type well region 172 is 6 micrometers. The surface concentration in p-type base region 173 is $3 \times 10^{16}$ cm$^{-3}$, and the diffusion depth of p-type base region 173 is 2 micrometers. The surface concentration of the p-type base region determines the threshold voltage of the power MOSFET.

A p-type diffusion region 179, which works as a p-type offset region, is formed in the surface portion of an n-type drift region (Ld section). The p-type diffusion region 179 is 1 micrometer in depth. The surface concentration of p-type diffusion region 179 is $5 \times 10^{16}$ cm$^{-3}$. Then, an insulation film 180, such as a LOCOS film made by thermal oxidation, is formed on p-type diffusion region 179. Insulation film 180 is 0.6 micrometer in thickness. An n-type source region 175 is in the surface portion of p-type base region 173. An n-type drain region 174 is in the surface portion of n-type well region 172. The n-type source region 175 and n-type drain region 174 are spaced apart from each other with p-type diffusion region 179 interposed therebetween. A polysilicon gate electrode 177 is formed on the extended portion of p-type base region 173 extended between n-type source region 175 and n-type well region 172 with a gate oxide film 183 of 25 nm in thickness interposed therebetween. Not shown are n$^+$-type contact regions, 0.2 micrometer in diffusion depth, which are formed in n-type source region 175 and n-type drain region 174. The surface concentration of the n$^+$-type contact region is $1 \times 10^{20}$ cm$^{-3}$. A p$^+$-type contact region 176 is formed in the surface portion of p-type base region 173. The surface concentration of p$^+$-type contact region 176 is $5 \times 10^{19}$ cm$^{-3}$. The diffusion depth of p$^+$-type contact region 176 is 0.5 micrometer. A interlayer insulation film (not shown) is formed. Contact holes are bored through the interlayer insulation film. A source electrode 181 and a drain electrode 182 are formed. Insulation film 180 is extended onto n-type well region 172, and gate electrode 177 is extended onto the extended portion of insulation film 180. In this structure, the total donor amount in n-type well region 172 below p-type diffusion region 179 is $1 \times 10^{12}$ cm$^{-2}$. A high breakdown voltage is obtained by optimizing the total donor amount in n-type well region 172, the impurity concentration in p-type diffusion region 179, and the width Ld of the n-type drift region. The structure is effective to reduce the on-resistance by increasing the impurity concentration in n-type well region 172, while optimizing the respective impurity concentrations in p-type diffusion region 179 and n-type well region 172 independently.

The conventional steps for forming p-type diffusion region 179 will be briefly described below. FIG. 22(a) is a cross-sectional view illustrating the conventional ion implantation step for forming a p-type impurity diffusion region. FIG. 22(b) is a cross-sectional view for explaining the conventional thermal diffusion step for forming the p-type impurity diffusion region.

Referring to FIG. 22(a), a photoresist 52 is formed on an n-type silicon substrate 51. A photomask (not shown) is positioned on photoresist 52. Photoresist 52 is patterned through this photomask to obtain a mask having an opening, through which ions are implanted. Then boron ion irradiation 55 is performed over the entire surface of silicon substrate 51. Boron ions 54 are implanted through the opening of photoresist 52 into a diffusion region 53. Referring to FIG. 22(b), photoresist 52 is removed. The implanted boron ions are activated thermally and diffused thermally into silicon substrate 51, resulting in a p-type region 56.

Alternatively, an SiO$_2$ film may be used as a mask for the ion implantation. In that case, a sheet of photomask, which is a sheet of glass patterned with emulsion or chromium, is prepared to form a mask for ion implantation.

FIG. 23 is a cross-sectional view of a conventional lateral power MOSFET exhibiting a high breakdown voltage and including the impurity diffusion region described with reference to FIGS. 22(a) and 22(b). The lateral power MOSFET of FIG. 23 exhibits a breakdown voltage of 700 V or higher. When a gate signal of +5 V is applied to a gate electrode 608, a channel is created in a p-type base region 603 beneath a gate electrode. Electrons flow from an n-type source region 604 to an n-type drift region (n-type substrate 601) via the channel. The electrons are absorbed into an n-type drain region 605, resulting in an ON-state of the device. When the gate signal is removed, a reverse bias voltage is applied across the pn-junction plane between p-type base region 603 and the n-type drift region (n-type silicon substrate 601), and the pn-junction plane between the n-type drift region (n-type silicon substrate 601) and a p-type offset region 602, such that a certain breakdown voltage is secured by the entire structure of the device, In FIG. 23, there are shown a p-type contact region 606, a gate oxide film 607, an insulation film 609, a source electrode 610 and a drain electrode 611.

FIG. 24 shows an electric field strength distribution (a) in the cross-section (b) of the conventional semiconductor device exhibiting a high breakdown voltage shown in FIG. 21. When n-type well region 172 in FIG. 21 is heavily doped to reduce the on-voltage, intensive electric field localization is caused on the side of the source electrode as shown in (a) of FIG. 24. Since p-type diffusion region 179 is extended toward the drain electrode, intensive electric field localization is caused also in the anode side surface as shown in (a) of FIG. 24. Due to the electric field localization described above, the electric field strength EA at location A, or the electric field strength EB at location B on the boundary of the oxide film, exceeds $3\times10^5$ V/cm, causing a breakdown at location A or B. The breakdown voltage of the structure is determined by the surface structure, and it is also affected (1) by parasitic charges on the boundary of and in the oxide film and (2) by external parasitic charges on the device surface, making the breakdown voltage unstable. When the device is molded with a resin, more intense electric field localization is caused by the moveable ions in the mold resin, reducing the breakdown voltage in some cases. Since the margin of the implanted ion dose amounts in n-type well region 172 and p-type diffusion region 179 for the breakdown voltage is small, a low breakdown voltage is caused by deviations in the amount of the implanted ion dose.

In view of the foregoing, it is an object of the invention to provide a semiconductor device exhibiting a high breakdown voltage, which is also manufactured at low manufacturing cost. It is another object of the invention to provide a semiconductor device that obviates the problems described above and facilitates stabilizing the high breakdown voltage thereof. It is still another object of the invention to provide a method for manufacturing a semiconductor device exhibiting a high breakdown voltage, specifically a method for forming an impurity diffusion region in the semiconductor device.

SUMMARY OF THE INVENTION

According to a first aspect of the invention, there is provided a semiconductor device exhibiting a high breakdown voltage, the semiconductor device including: (1) a first region of a first conductivity type (n-type well region); (2) a second region of a second conductivity type (p-type base region) formed selectively in the surface portion of the first region; (3) a third region of the first conductivity type (n-type drain region) formed selectively in the surface portion of the first region, the second region and the third region being spaced apart from each other; (4) a fourth region of the first conductivity type (n-type source region) formed selectively in the surface portion of the second region; (5) a fifth region of the second conductivity type (p-type offset region: p-type diffusion region) formed selectively in the surface portion of the first region between the second region and the third region; (6) a first insulation film (thermally oxidized film such as a LOCOS film) on the fifth region; (7) a gate electrode above the extended portion of the second region, extending between the fourth region and the first region with a gate insulation film interposed between the extended portion of the second region and the gate electrode; (8) a first main electrode (source electrode) on the fourth region; (9) a second main electrode (drain electrode) on the third region; and (10) a plurality of sub-regions in the fifth region, which subregions are aligned between the second region (p-type base region) and the third region (n-type drain region). The impurity concentrations of these sub-regions are different from each other.

Advantageously, the depths of the sub-regions of the fifth region are different from each other. Also advantageously, the gate electrode is extended onto the first insulation film.

According to a second aspect of the invention, there is provided a semiconductor device exhibiting a high breakdown voltage, the semiconductor device including: (1) a semiconductor substrate of a second conductivity type; (2) a first region of a first conductivity type formed selectively in the surface portion of the semiconductor substrate; (3) a second region of the second conductivity type formed selectively in the surface portion of the semiconductor substrate; (4) a third region of the first conductivity type formed selectively in the surface portion of the first region, the second region and the third region being spaced apart from each other; (5) a fourth region of the first conductivity type formed selectively in the surface portion of the second region; (6) a fifth region of the second conductivity type formed selectively in the surface portion of the first region between the second region and the third region; (7) a first insulation film on the fifth region; (8) a gate electrode above the extended portion of the second region and extending between the fourth region and the first region with a gate insulation film interposed between the extended portion of the second region and the gate electrode; (9) a first main electrode on the fourth region; (10) a second main electrode on the third region; and (11) a plurality of sub-regions in the fifth region, which are aligned between the second region and the third region, the impurity concentrations of these sub-regions being different from each other.

Advantageously, the impurity concentration of the sub-region on the side of the second region is higher than the impurity concentration of the sub-region on the side of the third region. Also advantageously, the diffusion depth of the sub-region on the side of the second region is deeper than the diffusion depth of the sub-region on the side of the third region. Further, the impurity concentration of the sub-region is preferably the concentration of an impurity of the second conductivity type. Still further, the surface concentration of the fifth region of the second conductivity type is preferably changed by adding an impurity of the first conductivity type, the amount thereof being less than the amount of the impurity of the second conductivity type in the fifth region.

The electric field strength is relaxed by forming the p-type offset region of a plurality of sub-regions, the impurity concentrations and the depths thereof being different from each other, respectively. The extended portion of the gate electrode extending onto the thermally oxidized film works as a field plate, which facilitates relaxing the electric field strength around the extended portion of the gate electrode.

According to a third aspect of the invention, there is provided a method of manufacturing a semiconductor device exhibiting a high breakdown voltage, the method including the steps of: (1) selectively forming a second region of a second conductivity type (p-type base region) and a third region of a first conductivity type (n-type drain region) in the surface portion of a first region of the first conductivity type (n-type well region), the second region and the third region being spaced apart from each other; (2) selectively forming a fourth region of the first conductivity type (n-type source region) in the surface portion of the second region; (3) selectively forming a fifth region of the second conductivity type (p-type offset region: p-type diffusion region) in the surface portion of the first region between the second region and the third region; (4) forming a first insulation film (thermally oxidized film) on the fifth region; (5) forming a gate electrode above the extended portion of the second region extending between the fourth region and the first region with a gate insulation film interposed between the extended portion of the second region and the gate electrode; (6) forming a first main electrode (source electrode) on the fourth region; and (7) forming a second main electrode (drain electrode) on the third region. The step of selectively forming the fifth region includes (a) the introduction of a predetermined amount of an impurity of the second conductivity type (p-type impurity) in the portion of the first region wherein the fifth region is intended to be formed; (b) dividing the portion of the first region intended into a plurality of sub-regions; (c) adding a further amount of the impurity of the second conductivity type to the sub-region nearer to the second region; and (d) thermally driving the impurity into the sub-regions collectively.

According to a fourth aspect of the invention, there is provided a method of manufacturing a semiconductor device exhibiting a high breakdown voltage, the method including the steps of: (1) selectively forming a second region of a second conductivity type and a third region of a first conductivity type in the surface portion of a first region of the first conductivity type, the second region and the third region being spaced apart from each other; (2) selectively forming a fourth region of the first conductivity type in the surface portion of the second region; (3) selectively forming a fifth region of the second conductivity type in the surface portion of the first region between the second region and the third region; (4) forming a first insulation film on the fifth region; (5) forming a gate electrode above the extended portion of the second region extending between the fourth region and the first region with a gate insulation film interposed between the extended portion of the second region and the gate electrode; (6) forming a first main electrode on the fourth region; (7) forming a second main electrode on the third region. In this aspect of the invention, the step of selectively forming the fifth region includes: (a) introducing a predetermined amount of an impurity of the second conductivity type in the portion of the first region, wherein the fifth region is intended to be formed; (b) dividing the intended portion of the first region into a plurality of sub-regions; (c) adding a further amount of the impurity of the second conductivity type to the sub-region nearer to the second region; and (d) introducing a further amount of an impurity of the first conductivity type to the sub-region nearer to the third region, the amount of the impurity of the first conductivity type being less than the predetermined amount of the impurity of the second conductivity type; and (e) thermally driving the impurities into the sub-regions collectively.

According to a fifth aspect of the invention, there is provided a method of manufacturing a semiconductor device exhibiting a high breakdown voltage, the method including the steps of: (1) selectively forming a second region of a second conductivity type and a third region of a first conductivity type in the surface portion of a first region of the first conductivity type, the second region and the third region being spaced apart from each other; (2) selectively forming a fourth region of the first conductivity type in the surface portion of the second region; (3) selectively forming a fifth region of the second conductivity type in the surface portion of the first region between the second region and the third region; (4) forming a first insulation film on the fifth region; (5) forming a gate electrode above the extended portion of the second region extending between the fourth region and the first region with a gate insulation film interposed between the extended portion of the second region and the gate electrode; (6) forming a first main electrode on the fourth region; and (7) forming a second main electrode on the third region. In this aspect of the invention, the step of selectively forming the fifth region includes: (a) dividing the portion of the first region, wherein the fifth region is intended to be formed, into a plurality of sub-regions; (b) introducing a further amount of an impurity of the first conductivity type to the sub-region nearer to the third region; (c) introducing a predetermined amount of an impurity of the second conductivity type to the sub-regions, the predetermined amount of the impurity of the second conductivity type being more than the amount of the impurity of the first conductivity type; and (d) thermally driving the impurities into the sub-regions collectively.

Advantageously, the method further includes the step of extending the gate electrode onto the first insulation film. Also advantageously, the method further includes the step of selectively forming the first region in the surface portion of a semiconductor substrate of the second conductivity type.

According to a sixth aspect of the invention, there is provided a method of manufacturing a semiconductor device exhibiting a high breakdown voltage, the method including the steps of: (1) forming a mask for ion implantation, the mask having an opening, the area thereof becoming wider toward the semiconductor substrate; (2) implanting impurity ions into the surface portion of the semiconductor substrate below the opening of the mask; and (3) thermally driving the implanted impurity ions to form an impurity diffusion region in the semiconductor substrate.

Advantageously, the step of forming a mask includes laminating a plurality of layers on the semiconductor substrate, followed by etching the layers one by one from the uppermost layer to the lowermost layer, using the upper layer as a mask for etching the lower layer so as to form a wider opening in the lower layer.

According to a seventh aspect of the invention, there is provided a method of manufacturing a semiconductor device exhibiting a high breakdown voltage, the method including the steps of: (1) forming an oxide film on a semiconductor substrate; (2) coating a photoresist on the oxide film; (3) positioning a photomask on the photoresist; (4) selectively forming an opening in the photoresist through the photomask; (5) removing the portion of the oxide film beneath the opening of the photoresist and the portion of the oxide film in a predetermined lateral range from the edge of the opening of the photoresist, using the photoresist as a mask; (6) implanting impurity ions through the opening of the photoresist, the oxide film and the photoresist to implant the impurity ions into the surface portion of the semiconductor substrate beneath:

(a) the opening of the photoresist,
(b) the surface portion of the semiconductor substrate beneath the photoresist but not covered by the oxide film and
(c) the surface portion of the semiconductor substrate beneath the oxide film;

and (7) thermally driving the implanted impurity ions to form an impurity diffusion region in the semiconductor substrate.

According to an eighth aspect of the invention, there is provided a method of manufacturing a semiconductor device exhibiting a high breakdown voltage, the method including the steps of: (1) forming an oxide film on a semiconductor substrate; (2) forming a nitride film on the oxide film; (3) coating a photoresist on the nitride film; (4) curing the photoresist; (5) selectively forming an opening in the photoresist by photolithography; (6) removing the portion of the nitride film beneath the opening of the photoresist to form an opening in the nitride film; (7) removing the portion of the oxide film beneath the opening of the nitride film and the portion of the oxide film in a predetermined lateral range from the edge of the opening of the nitride film, using the nitride film as a mask to form an opening in the oxide film; (8) implanting boron ions into the entire surface portion of the semiconductor substrate using the photoresist, the nitride film and the oxide film as a mask; (9) removing the mask formed by the photoresist, the nitride film and the oxide film; and (10) thermally driving the implanted boron ions to form an impurity diffusion region in the semiconductor substrate.

According to a ninth aspect of the invention, there is provided a method of manufacturing a semiconductor device exhibiting a high breakdown voltage, the method including the steps of: (1) forming an oxide film on a semiconductor substrate; (2) forming a nitride film on the oxide film; (3) coating a photoresist on the nitride film; (4) positioning a photomask on the photoresist; (5) selectively forming an opening in the photoresist through the photomask; (6) removing the portion of the nitride film beneath the opening of the photoresist and the portion of the nitride film in a predetermined lateral range from the edge of the opening of the photoresist, using the photoresist as a mask; (7) implanting impurity ions of a first conductivity type into the semiconductor substrate using the photoresist as a mask; (8) removing the photoresist; (9) thermally treating the portion of the oxide film not covered by the nitride film to form a selectively oxidized film; (10) removing the nitride film; (11) implanting impurity ions of a second conductivity type into the semiconductor substrate using the selectively oxidized film as a mask; and (12) thermally driving the implanted impurity ions of the first conductivity type and the implanted impurity ions of the second conductivity type to form an impurity diffusion region of the first conductivity type and an impurity diffusion region of the second conductivity type in the semiconductor substrate.

DETAILED DESCRIPTION OF THE INVENTION

Figure 19:
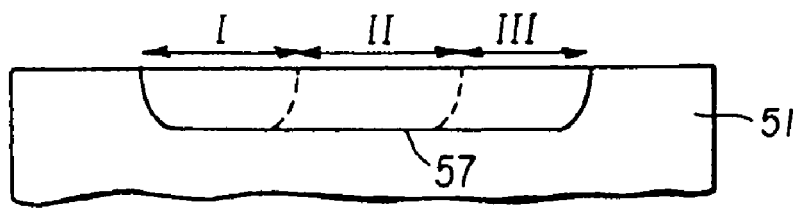
FIG. 19 is a cross-sectional view of a semiconductor device including a p-type region formed of a plurality of p-type sub-regions, the impurity concentrations thereof differing from each other.

The invention will now be explained with reference to the accompanying drawings, which illustrate the preferred embodiments of the invention. The semiconductor device according to the invention includes, as shown in FIG. 19, a p-type region (p-type offset region) 57 including a plurality of sub-regions, the impurity concentrations thereof differing from sub-region to sub-region. This p-type region is substituted for p-type region 602 (p-type offset region) shown in FIG. 23, in which the impurity concentration distribution and the depth are uniform. The semiconductor device according to the invention, which includes p-type region 57 described above, facilitates the prevention of electric field localization. In FIG. 19, p-type region 57 includes three sub-regions I, II and III, the impurity concentrations thereof differing from sub-region to sub-region. The sub-regions, having the impurity concentrations that differ from each other, are formed by one of the following two methods (a first method and a second method).

Figure 20:
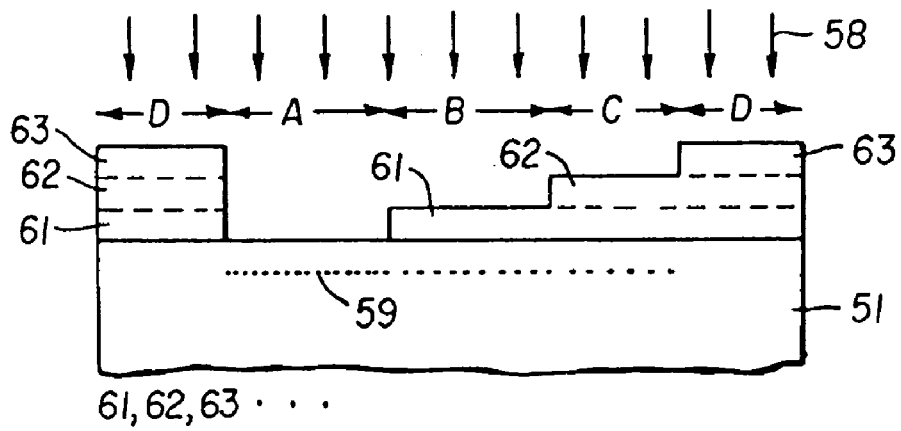
FIG. 20 is a cross-sectional view of a semiconductor substrate with a plurality of masks formed thereon to form a p-type region, including a plurality of sub-regions in which the impurity concentrations differ from each other.
Figure 21:
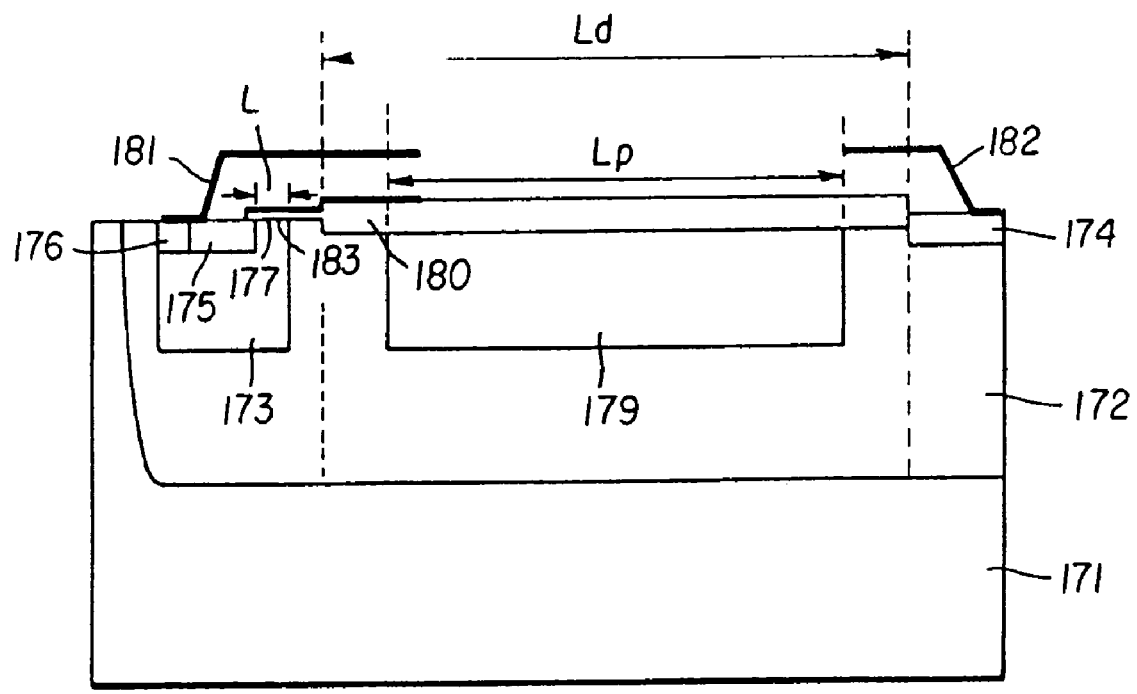
FIG. 21 is a cross-sectional view of a conventional semiconductor device exhibiting a high breakdown voltage.
Figure 22A:
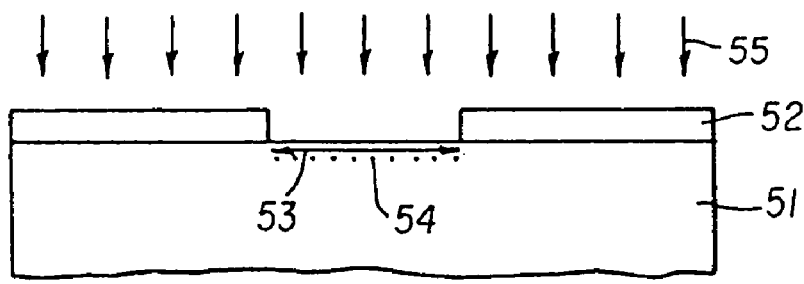
FIG. 22(a) is a cross-sectional view illustrating the conventional ion implantation step for forming a p-type impurity diffusion region.
Figure 22B:
FIG. 22(b) is a cross-sectional view for explaining the conventional thermal diffusion step for forming the p-type impurity diffusion region.

Although not illustrated, the first method repeats multiple times the ion implantation shown in FIG. 22(a), with the masks being changed from one ion implantation to another and, then, thermally driving all the implanted ions at once. The second method prepares three kinds of masks 61, 62 and 63; combines the masks 61, 62 and 63 appropriately, such that the resultant local mask thickness is different between the regions B, C and D, as shown in FIG. 20; and controls the dose amounts of ions 59 by one-step ion implantation 58.

In the first method, It is necessary to prepare as many photomasks as there are sub-regions, since one photomask is used for forming each sub-region. It is also necessary in the second method to prepare as many photomasks as there are sub-regions, since the local mask thickness is obtained by combining different masks.

Figure 1:
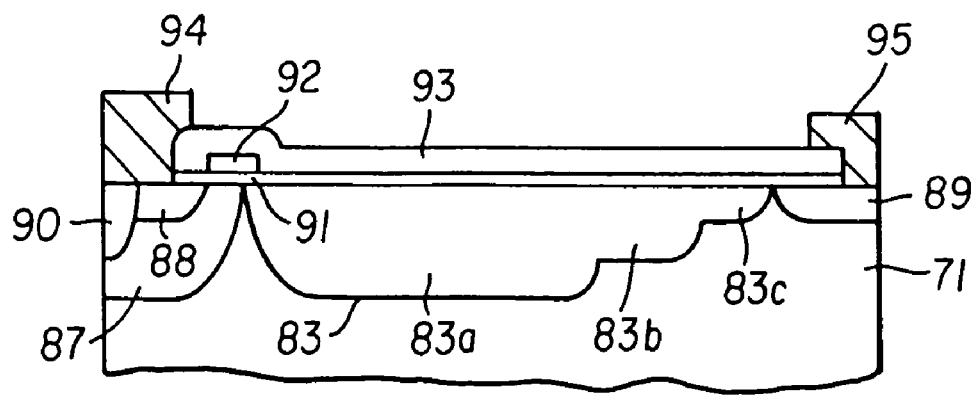
FIG. 1 is a cross-sectional view of a semiconductor device exhibiting a high breakdown voltage according to the first embodiment of the invention.

The first method will first be explained more in detail below. FIG. 1 is a cross-sectional view of a semiconductor device exhibiting a high breakdown voltage according to a first embodiment of the invention. The semiconductor device shown in FIG. 1 is a lateral MOSFET exhibiting a high breakdown voltage and including a p-type region (p-type offset region), which includes a plurality of sub-regions in which the impurity concentrations differ from each other. Referring to FIG. 1, the lateral MOSFET includes an n-type silicon substrate 71, a p-type base region 87 in the surface portion of substrate 71, an n-type drain region 89 in the surface portion of substrate 71, a p-type offset region 83 in the surface portion of substrate 71, an n-type source region 88 in the surface portion of p-type base region 87, and a p$^+$-type contact region 90 in the surface portion of p-type base region 87. The p-type offset region 83 includes a first p-type sub-region 83a, which has the highest the impurity concentration and the deepest diffusion depth; a second p-type sub-region 83b, which has an intermediate impurity concentration and diffusion depth; and a third p-type subregion 83c, which has the lowest impurity concentration and the shallowest diffusion depth. A gate electrode 92 is formed above the extended portion of p-type base region 87 extending between n-type source region 88 and n-type silicon substrate 71 (or p-type offset region 83), with a gate insulation film 91 interposed therebetween. An insulation film 93 is formed on gate electrode 92 and p-type offset region 83. A source electrode 94 is formed on n-type source region 88. A drain electrode 95 is formed on n-type drain region 89.

The p-type offset region 83 is different from the conventional p-type offset region in that p-type offset region 83 is formed of the first sub-region 83a, the second sub-region 83b and the third sub-region 83c. The impurity concentrations of these three sub-regions are different from each other. Table 1 lists the impurity distribution profile in p-type offset region 83.

TABLE 1

| Sub-regions | First sub-region | Second sub-region | Third sub-region |
|---|---|---|---|
| Surface impurity concentrations | $7 \times 10^{16}$ cm$^{-3}$ | $5 \times 10^{16}$ cm$^{-3}$ | $3 \times 10^{16}$ cm$^{-3}$ |
| Diffusion depths | 1.5 micrometers | 1.2 micrometers | 0.9 micrometers |

The surface concentration is the highest in the first sub-region 83a and the lowest in the third sub-region 83c.

Figure 2:
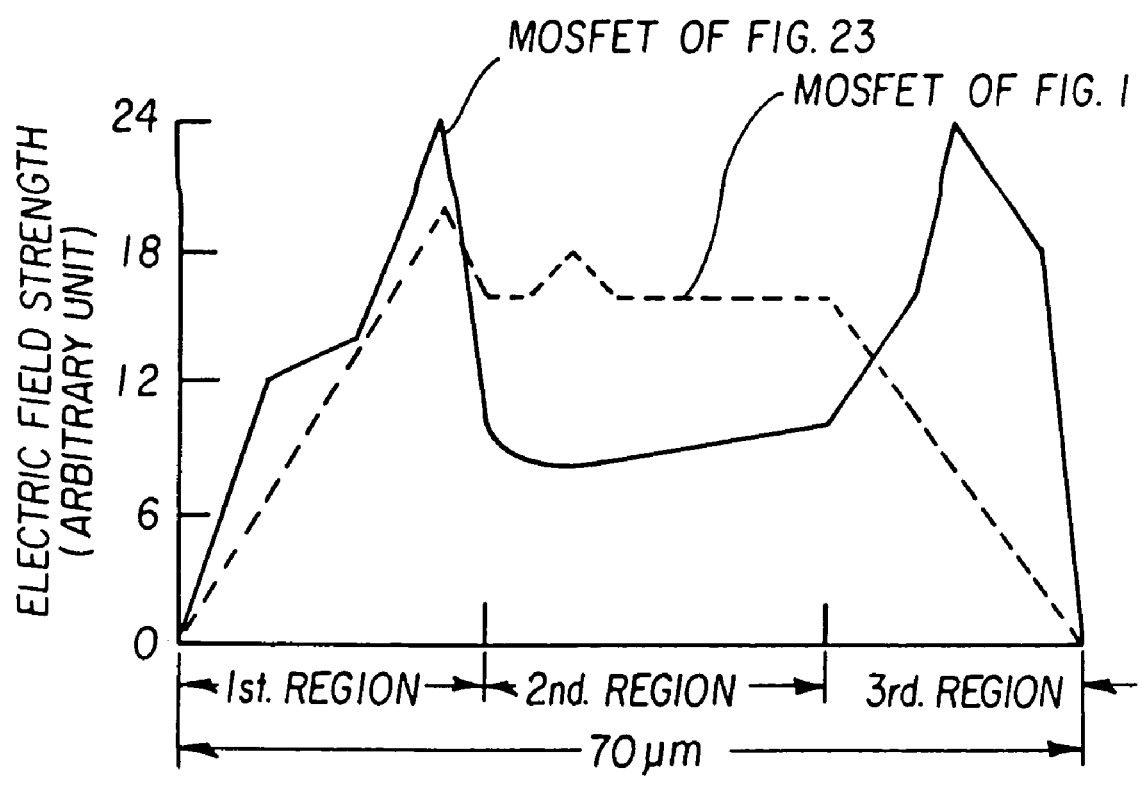
FIG. 2 shows a pair of curves for comparing the distributions of electric field strength in the conventional p-type offset region and the p-type offset region according to the invention, including a plurality of sub-regions in which the impurity concentrations differ from each other.

FIG. 2 shows a pair of curves for comparing the distributions of electric field strength in the conventional p-type offset region and p-type offset region 83 that includes a plurality of sub-regions of differing impurity concentrations.

Figure 23:
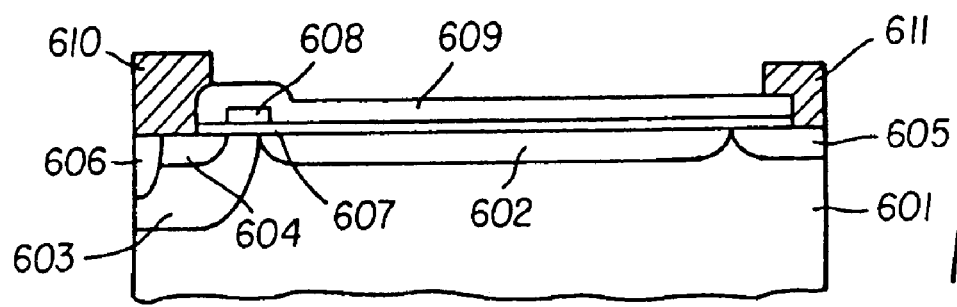
FIG. 23 is a cross-sectional view of a conventional lateral power MOSFET exhibiting a high breakdown voltage and including the impurity diffusion region described with reference to FIGS. 22(a) and 22(b).
Figure 24:
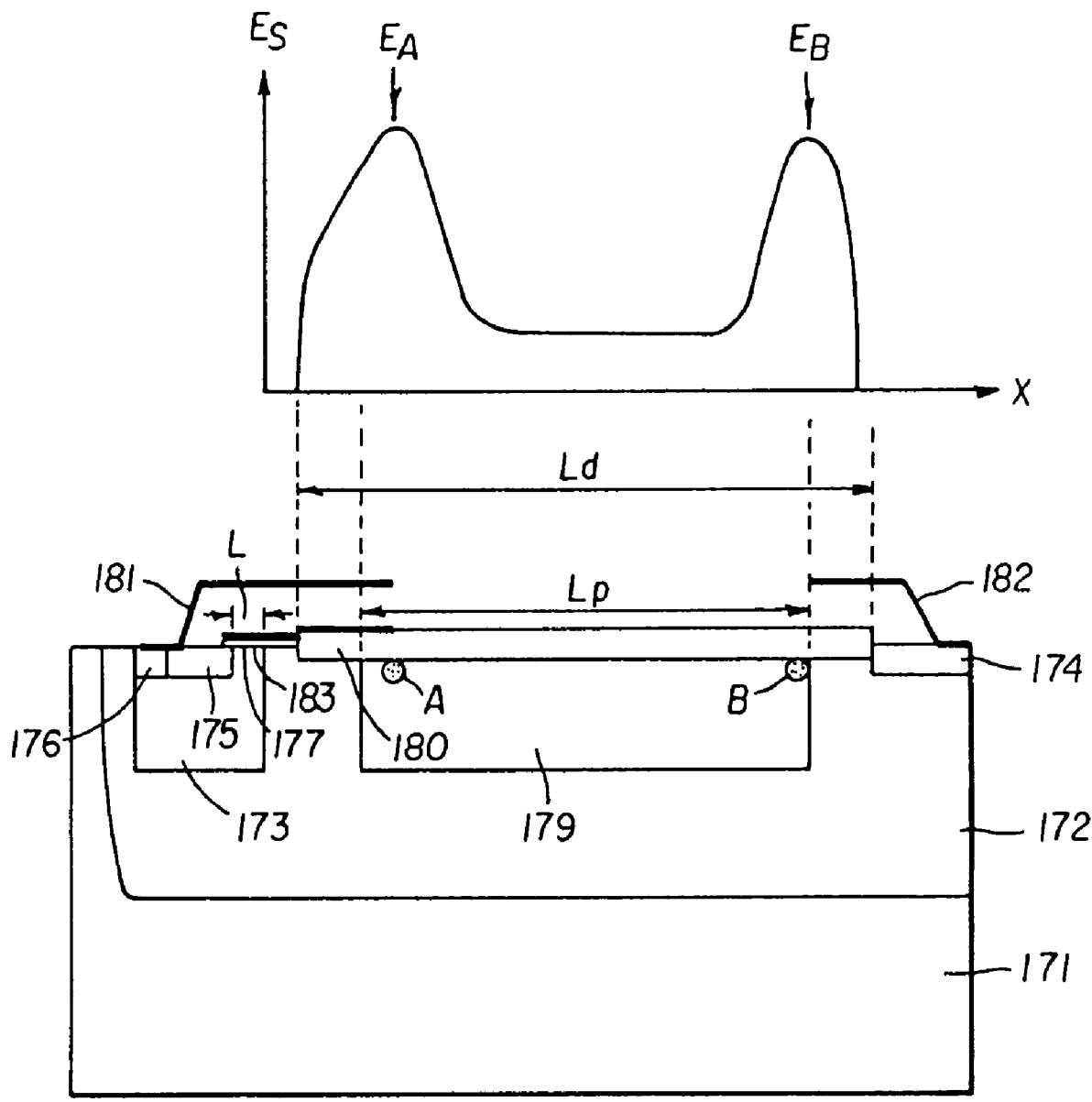
FIG. 24 shows an electric field strength distribution across a conventional semiconductor device exhibiting a high breakdown voltage, as shown in FIG. 21.

When the conventional device shown in FIG. 23 is in the OFF-state, the electric field strength is abnormally high at both ends of p-type offset region 602. When the device according to the first embodiment shown in FIG. 1 is in the OFF-state, the electric field strength is rather uniform across p-type offset region 83, resulting in improved reliability with respect to breakdown voltage of the device.

The method of forming a p-type offset region including a plurality of sub-regions of differing impurity concentrations will be explained below. FIGS. 3 through 12 are cross-sectional views for explaining the manufacturing steps according to a second embodiment of the invention for forming a p-type offset region including a plurality of sub-regions, in which the impurity concentrations differ from each other, in a semiconductor device exhibiting a high breakdown voltage.

Figure 3:
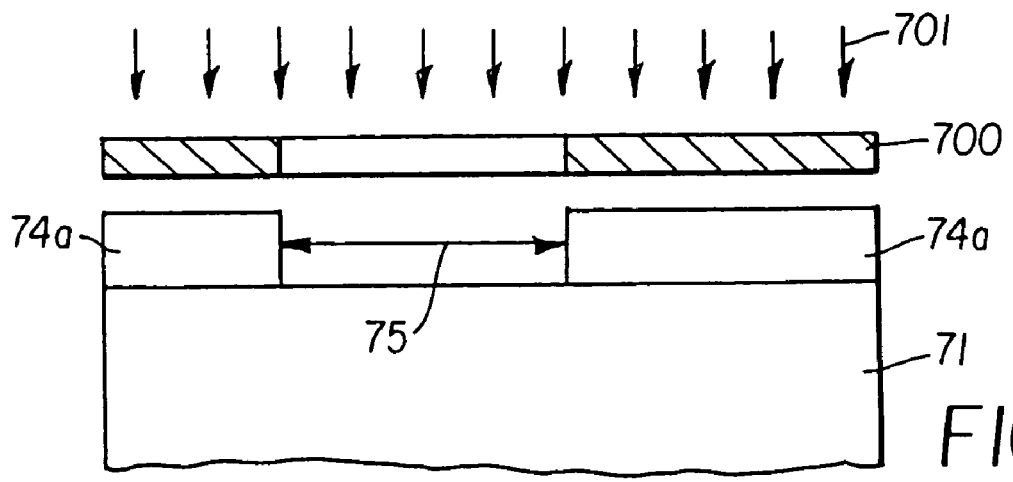
FIG. 3 is a cross-sectional view illustrating one of the manufacturing steps according to the second embodiment of the invention for manufacturing a semiconductor device exhibiting a high breakdown voltage.

Referring to FIG. 3, a photoresist 74a is coated on n-type silicon substrate 71. An ultraviolet ray 701 is irradiated through a photomask 700. Then, an opening 75 is formed through photoresist 74a by etching.

Figure 4:
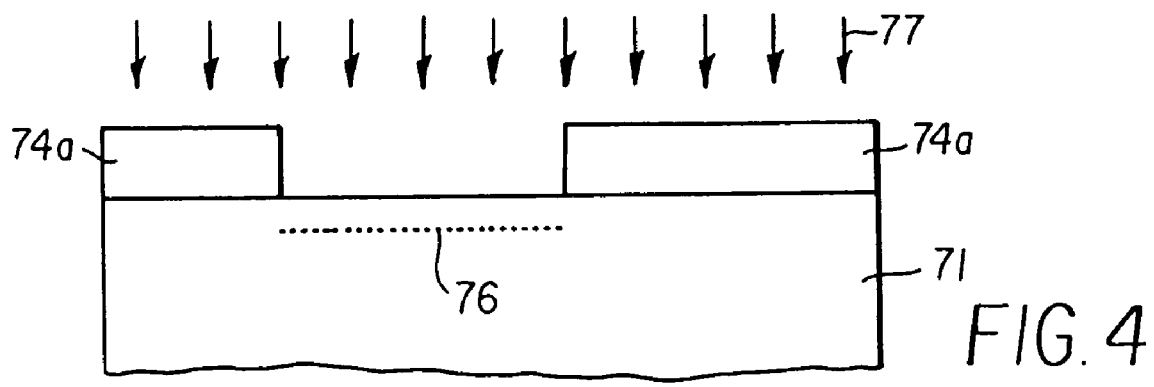
FIG. 4 is a cross-sectional view illustrating one of the manufacturing steps according to the second embodiment of the invention for manufacturing a semiconductor device exhibiting a high breakdown voltage.
Figure 5:
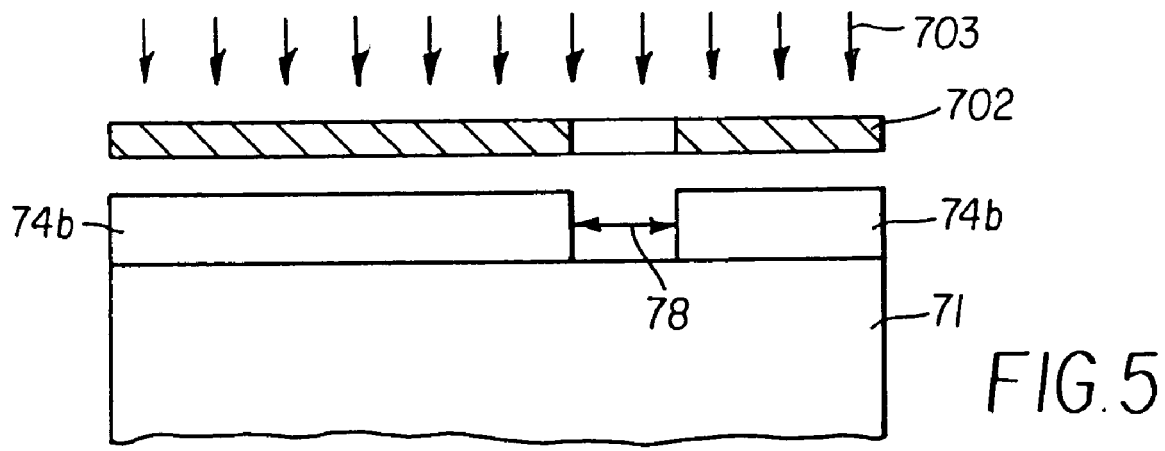
FIG. 5 is a cross-sectional view illustrating one of the manufacturing steps according to the second embodiment of the invention for manufacturing a semiconductor device exhibiting a high breakdown voltage.

Referring to FIG. 4, boron ion implantation 77 is conducted at a high dose amount to implant boron ions 76 into n-type silicon substrate 71. Referring to FIG. 5, photoresist 74a is then removed from n-type silicon substrate 71, a photoresist 74b is coated on n-type silicon substrate 71, an ultraviolet ray 703 is irradiated through a photomask 702, and an opening 78 is formed through photoresist 74b by etching.

Figure 6:
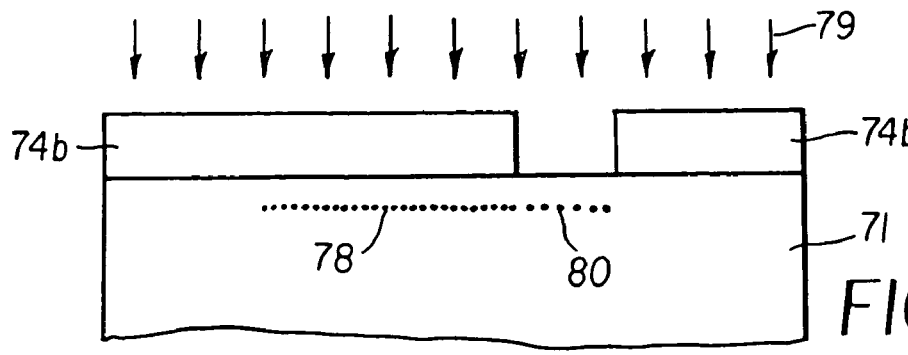
FIG. 6 is a cross-sectional view illustrating one of the manufacturing steps according to the second embodiment of the invention for manufacturing a semiconductor device exhibiting a high breakdown voltage.
Figure 7:
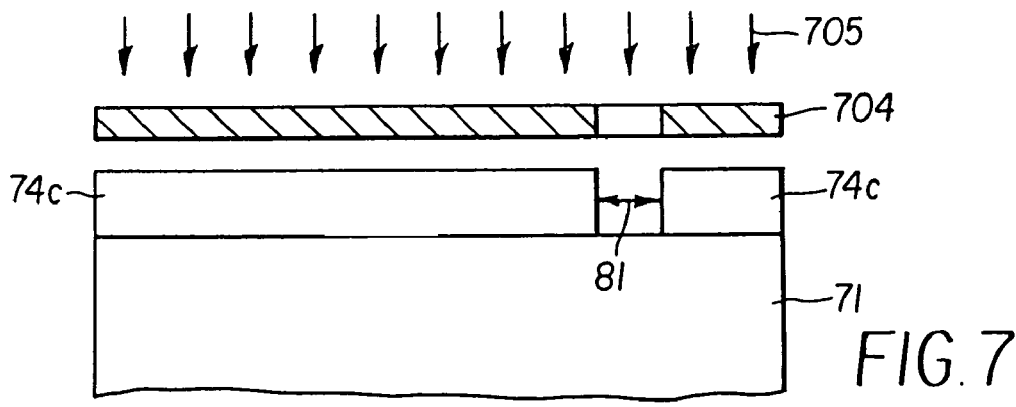
FIG. 7 is a cross-sectional view illustrating one of the manufacturing steps according to the second embodiment of the invention for manufacturing a semiconductor device exhibiting a high breakdown voltage.

Referring to FIG. 6, boron ion implantation 79 is conducted at an intermediate dose amount to implant boron ions 80 into n-type silicon substrate 71. Referring to FIG. 7, photoresist 74b is removed from n-type silicon substrate 71, a photoresist 74c is coated on n-type silicon substrate 71, an ultraviolet ray 705 is irradiated through a photomask 704, and an opening 81 is formed through photoresist 74c by etching.

Figure 8:
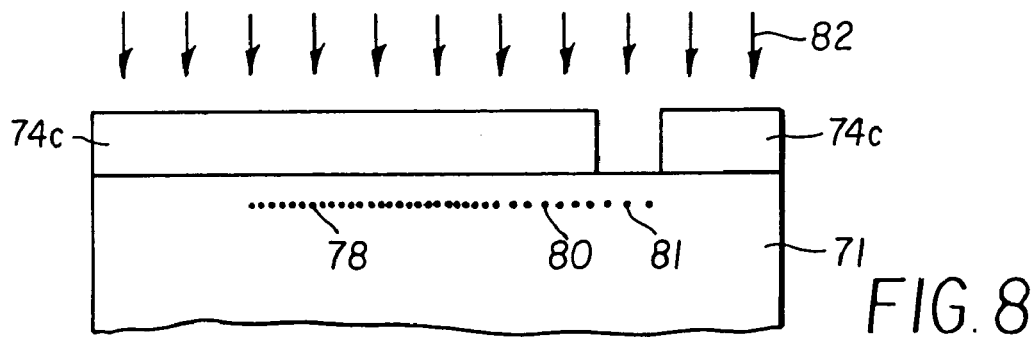
FIG. 8 is a cross-sectional view illustrating one of the manufacturing steps according to the second embodiment of the invention for manufacturing a semiconductor device exhibiting a high breakdown voltage.
Figure 9:
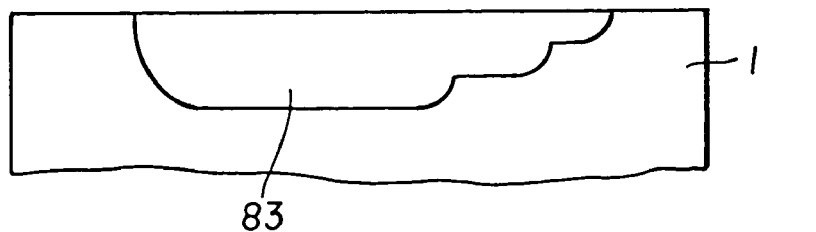
FIG. 9 is a cross-sectional view illustrating one of the manufacturing steps according to the second embodiment of the invention for manufacturing a semiconductor device exhibiting a high breakdown voltage.

Referring to FIG. 8, boron ion implantation 82 is conducted at a low dose amount to implant boron ions 81 into n-type silicon substrate 71. Referring to FIG. 9, the implanted boron ions are thermally driven to form p-type region 83, which includes three sub-regions having impurity concentrations that differ from each other. The p-type region 83 will be a p-type offset region.

Figure 10:
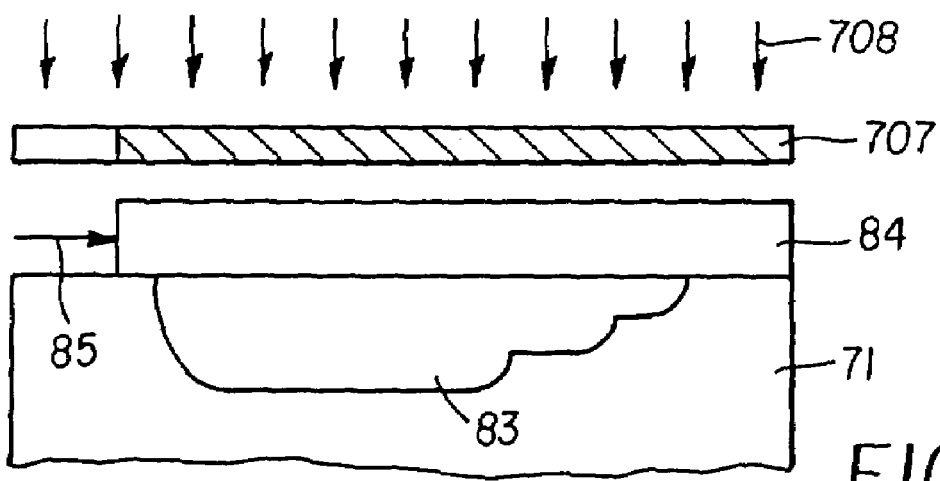
FIG. 10 is a cross-sectional view illustrating one of the manufacturing steps according to the second embodiment of the invention for manufacturing a semiconductor device exhibiting a high breakdown voltage.
Figure 11:
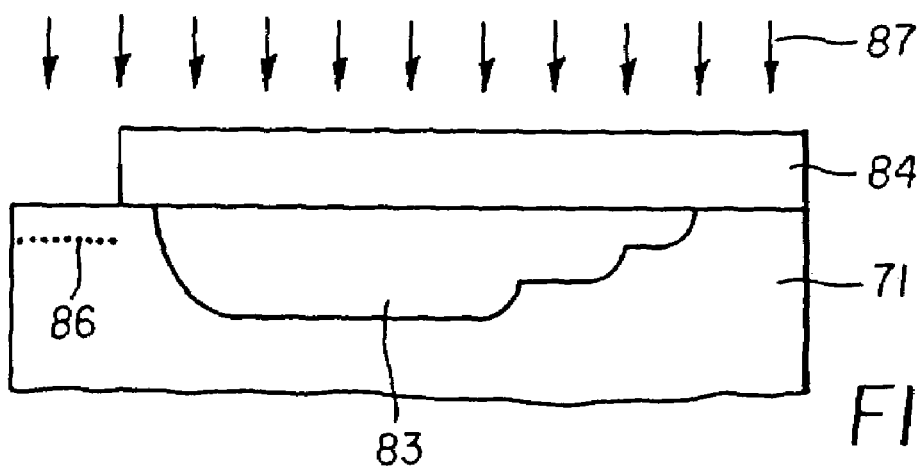
FIG. 11 is a cross-sectional view illustrating one of the manufacturing steps according to the second embodiment of the invention for manufacturing a semiconductor device exhibiting a high breakdown voltage.
Figure 12:
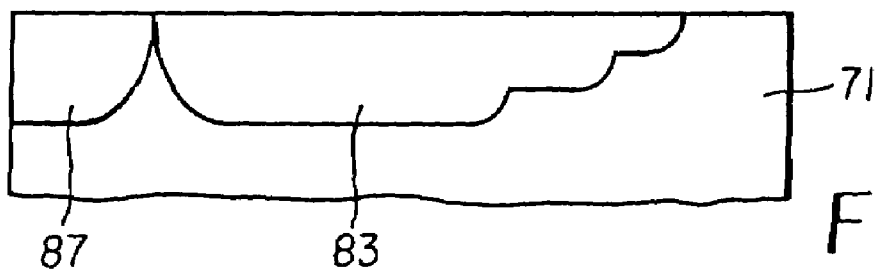
FIG. 12 is a cross-sectional view illustrating one of the manufacturing steps according to the second embodiment of the invention for manufacturing a semiconductor device exhibiting a high breakdown voltage.

Referring to FIG. 10, a photoresist 84 is coated on n-type silicon substrate 71 and p-type region 83, an ultraviolet ray 708 is irradiated through a photomask 707, and an opening 85 is formed through photoresist 84 by etching. Referring to FIG. 11, boron ion implantation 87 is conducted at a high dose amount to implant boron ions 86 into n-type silicon substrate 71. Referring to FIG. 12, the implanted boron ions are thermally driven to form p-type region 87, which will be a p-type base region. Then, the lateral MOSFET exhibiting a high breakdown voltage shown in FIG. 1 is completed through additional manufacturing steps not shown, but known to those of ordinary skill in the art.

Accordingly, for forming a p-type offset region including three sub-regions, having impurity concentrations thereof that differ from each other, it is necessary to prepare three photomasks 700, 702 and 704 to conduct three photolithographic steps and to conduct three ion implantation steps at the respective dose amounts.

Figure 13:
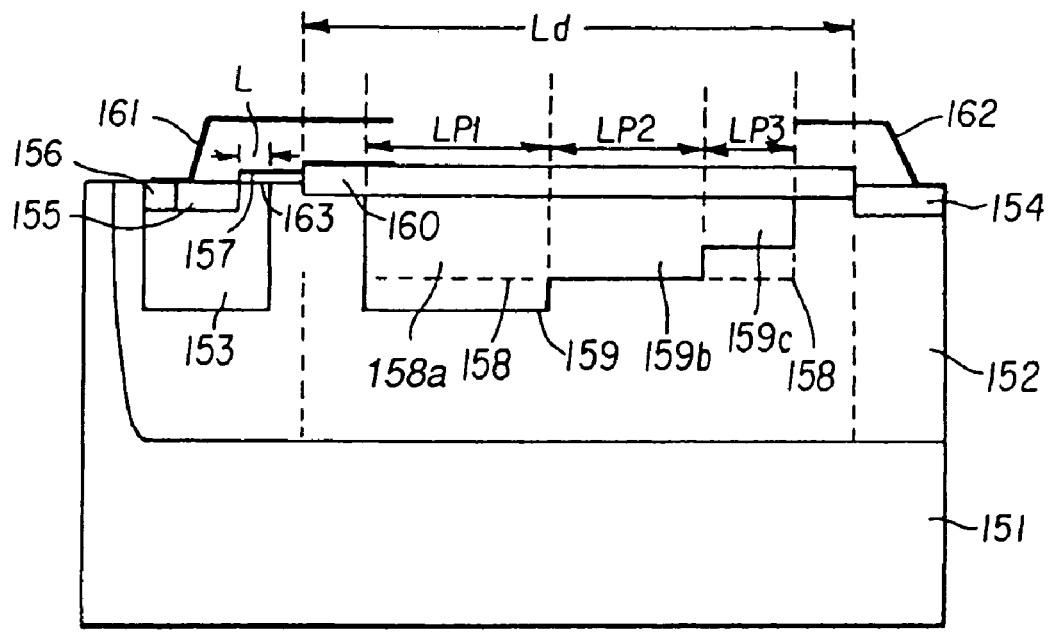
FIG. 13 is a cross-sectional view of a semiconductor device exhibiting a high breakdown voltage according to the third embodiment of the invention.

The method of manufacturing a semiconductor device exhibiting a high breakdown voltage will be explained in further detail below. FIG. 13 is a cross-sectional view of a semiconductor device exhibiting a high breakdown voltage according to a third embodiment of the invention. Referring now to FIG. 13, an n-type well region 152 is formed in the surface portion of a p-type substrate 151 with a high resistivity of 150 ohm-cm. A p-type base region 153 is formed in the surface portion of n-type well region 152. The surface concentration of n-type well region 152 is $3 \times 10^6$ $cm^{-3}$. The diffusion depth of n-type well region 152 is about 6 micrometers. After a p-type diffusion region 159 described later is formed, the total donor amount in n-type well region 152 is $1 \times 10^{12}$ $cm^{-3}$. A p-type diffusion region 159 (corresponding to p-type offset region 83 in FIG. 1) is formed in the surface portion of an n-type drift region (the Ld section of n-type well region 152). When the breakdown voltage is 700 V, the Ld section is 70 micrometers in width. The p-type diffusion region 159 is formed by a first p-type sub-region 159a in the $Lp_1$ section of p-type diffusion region 159, a p-type sub-region 159b in the $Lp_2$ section of p-type diffusion region 159, and a p-type sub-region 159c in the $Lp_3$ section of p-type diffusion region 159 (corresponding to the first p-type sub-region, the second p-type sub-region, and the third p-type sub-region of FIG. 1, respectively). For example, the width $Lp_1$ of sub-region 159a is 25 micrometers, the width $Lp_2$ of sub-region 159b is 20 micrometers, and the width $Lp_3$ of sub-region 159c is 25 micrometers. For example, the surface concentration in the $Lp_1$ section is set higher by about 10% than that in the $Lp_2$ section, and the surface concentration in the $Lp_3$ section is set lower by about 10% than that in the $Lp_2$ section. Specifically, the surface concentration in the $Lp_1$ section is $5.5 \times 10^{16}$ $cm^{-3}$, the surface concentration in the $Lp_2$ section is $5.0 \times 10^{16}$ $cm^{-3}$, and the surface concentration in the $Lp_3$ section is $4.5 \times 10^{16}$ $cm^{-3}$.

In the actual manufacturing process, boron ions are implanted into the region including the sections $Lp_1$, $Lp_2$ and $Lp_3$, so that the surface boron concentration may be $5.0 \times 10^{16}$ $cm^{-3}$ after heat treatment. Boron ions are added to the $Lp_1$ section so that the resultant surface boron concentration in the $Lp_1$ section may be $5.5 \times 10^{16}$ $cm^{-3}$ after heat treatment. Phosphorus ions are doped to the $Lp_3$ section, so that the surface phosphorus concentration in the $Lp_1$ section may be $0.5 \times 10^{16}$ $cm^{-3}$ after heat treatment to compensate for the boron concentration. Since the thermal drive steps are conducted under the same conditions for the sake of simplicity, the diffusion depth is about 1.1 micrometers for $Lp_1$ section, 1.0 micrometer for $Lp_2$ section, and 0.9 micrometer for $Lp_3$ section. Thus, the surface concentrations and the diffusion depths of the sub-regions 159a, 159b, and 159c are adjusted precisely by doping a certain amount of boron ions in advance and by then doping an additional amount of boron ions or phosphorus ions. The surface concentration in p-type base region 153 is $3 \times 10^{16}$ $cm^{-3}$. The diffusion depth of the p-type base region 153 is about 2 micrometers. The threshold voltage of the power MOSFET is set by the surface concentration in p-type base region 153. Alternatively, the p-type region including a plurality of sub-regions, in which both the surface concentration and the diffusion depths differ from each other, may be formed by only implanting boron ions, although the precision of this method of manufacturing is not as good.

Then, an insulation film 160 of 0.6 micrometer in thickness, such as a LOCOS film (thermally oxidized silicon film), is formed. A polysilicon gate electrode 157 is formed on a gate oxide film 163 (insulation) of 25 nm in thickness. The symbol L in FIG. 13 designates the region in which a channel is formed. Although not shown in FIG. 13, $n^+$-type contact regions are formed in an n-type source region 155 and an n-type drain region 154. The surface concentration of $n^+$-type contact regions is $1 \times 10^{20}$ $cm^{-3}$. The diffusion depth of $n^+$-type contact regions is 0.2 micrometer. A $p^+$-type contact region 156 is formed in the surface portion of p-type base region 153. The surface concentration of $p^+$-type contact region 156 is $5 \times 10^{19}$ $cm^{-3}$. The diffusion depth of $p^+$-type contact region 156 is 0.5 micrometer. An interlayer insulation film (not shown) is formed, and contact holes are bored. Also, a source electrode 161 and a drain electrode 162 are formed.

Various alternative methods may be employed to provide p-type diffusion region 159 with impurity concentration variations. The number of sub-regions in p-type diffusion region 159 is not limited to three (sub-region 159a, including the boron diffusion depth 158 as a dotted line, and subregions 159b and 159c). The number of sub-regions in p-type diffusion region 159 depends on the breakdown voltage class, the oxide film thickness, the state of mounting, the circumstances in which the device is used, and other such conditions. It is not always necessary to cover p-type base region 153 with n-type well region 152. The semiconductor device including an n-type well region connected to the channel region (L section), which is an n-type well region in surface contact with the p-type base region, operates properly as intended.

Figure 14:
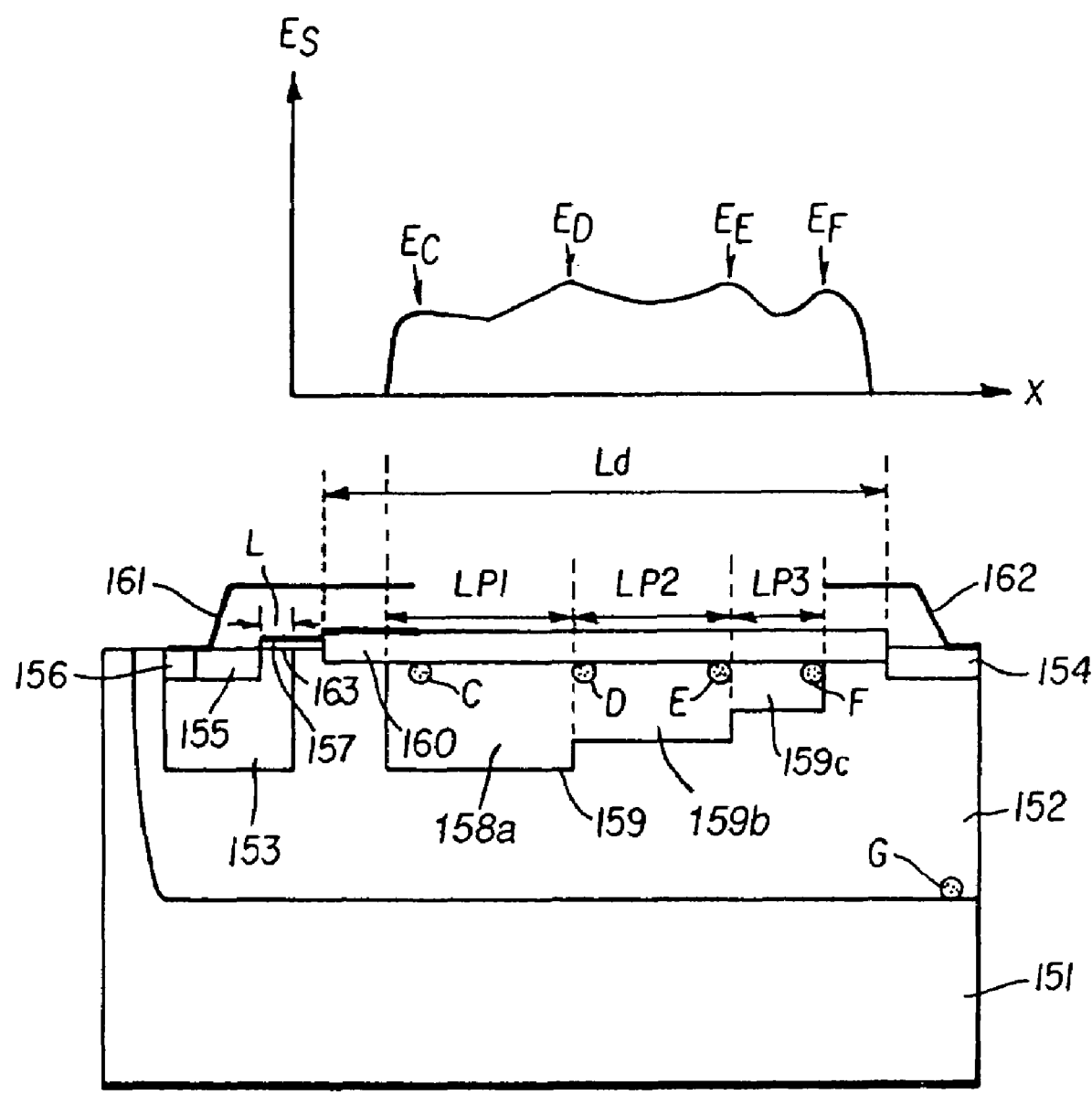
FIG. 14 shows the simulated distribution of the electric field strength across the cross-section of the semiconductor device according to the third embodiment of the invention.

It has been confirmed by simulation that the electric field strength distributes across the semiconductor structure described above, as illustrated in FIG. 14. The electric field strengths EC, ED, EE and EF at the points C, D, E and F are lower than $2 \times 10^5$ V/cm. The electric field strength is low at these points due to (1) the depletion layer expanding from the pn-junction between p-type base region 153 and n-type well region 152 to n-type well region 152 and (2) the depletion layer expanding from the pn-junction between n-type well region 152 and p-type diffusion region 159 to the portion of p-type diffusion region 159 near n-type drain region 154. The breakdown voltage of the device is determined by the breakdown voltage of the junction portion (point G) between n-type well region 152 and p-type substrate 151 below n-type drain region 154.

The structure described above facilitates securing a stable breakdown voltage at high temperature and under the application of high voltage over a long period of time. The volume of n-type well region 152 below p-type diffusion sub-region 159c, which causes the most part of the on-resistance, is increased in the structure of the invention over that exhibited in the conventional semiconductor structure, and the on-resistance is reduced. When n-type well region 152 is formed by diffusion, the heavily doped region is expanded, and the on-resistance is reduced by 5%, as compared to that of the conventional semiconductor structure.

Figure 15:
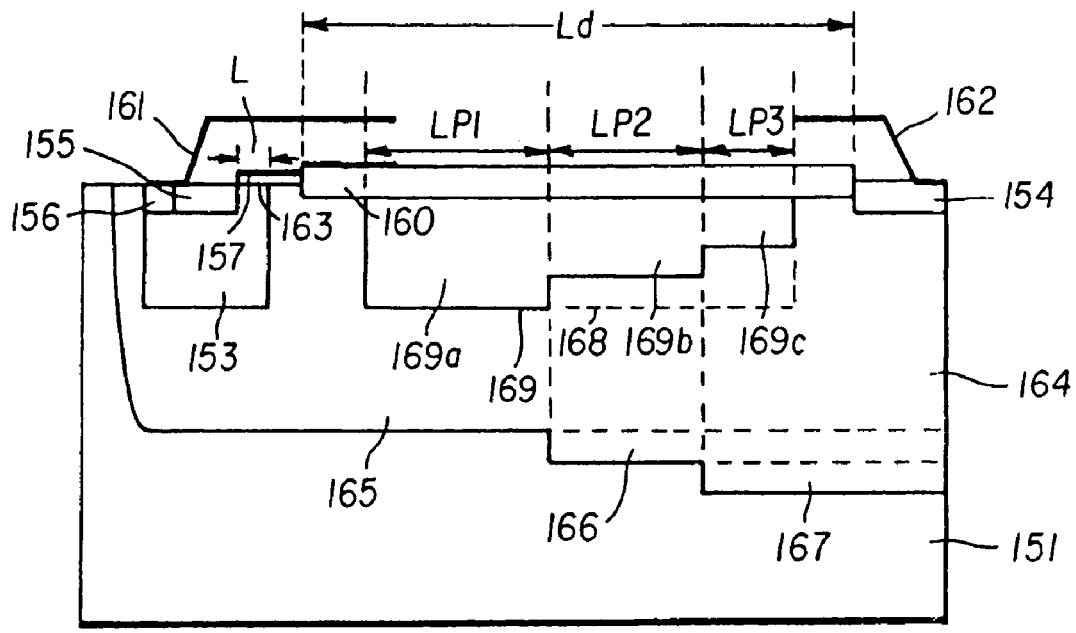
FIG. 15 is a cross-sectional view of a semiconductor device exhibiting a high breakdown voltage according to the fourth embodiment of the invention.

FIG. 15 is a cross-sectional view of a semiconductor device exhibiting a high breakdown voltage according to a fourth embodiment of the invention. Referring to FIG. 15, the semiconductor device according to the fourth embodiment includes a p-type substrate 151 with high resistivity of 150 ohm-cm, an n-type well region 164 in the surface portion of p-type substrate 151, and a p-type base region 153 in the surface portion of n-type well region 164. The n-type well region 164 includes a first n-type well sub-region 165, a second n-type well sub-region 166, and a third n-type well sub-region 167, with the impurity concentrations for each sub-region differing from each other. The surface concentration is $2.4\times10^{16}$ cm$^{-3}$ for first well sub-region 165, $3.0\times10^{16}$ cm$^{-3}$ for second well sub-region 166, and $3.6\times10^{16}$ cm$^{-3}$ for third well sub-region 167. The diffusion depth is 4 micrometers for first well sub-region 165, 5 micrometers for second well sub-region 166, and 6 micrometers for third well sub-region 167. For example, the width $Lp_1$ is about 25 micrometers, the width $Lp_2$ is about 20 micrometers, and the width $Lp_3$ is about 25 micrometers. A p-type diffusion region 169 (p-type offset region) including three diffusion sub-regions, in which the surface concentrations and the diffusion depths differ from each other, is formed in the surface portion of a section Ld of n-type well region 164 (an n-type drift region). The width of the section Ld is about 70 micrometers to guarantee the breakdown voltage of 700 V. To form p-type diffusion region 169, boron ions are doped collectively to the diffusion depth of 1.0 micrometer at the surface concentration of $5\times10^{16}$ cm$^{-3}$. The boron diffusion depth 168 is shown by a broken line. As a result, a first diffusion sub-region 169a (p-type) is in the surface portion of first well sub-region 165, a second diffusion sub-region 169b (p-type) is in the surface portion of second well sub-region 166, and a third diffusion sub-region 169c (p-type) is in the surface portion of third well sub-region 167.

In the actual manufacturing process, phosphorus ions are implanted to the portion of the n-type well region that includes the sections $Lp_1$, $Lp_2$ and $Lp_3$. The dose amount is that amount that will produce, after heat treatment, a surface phosphorus concentration of about $2.4\times10^{16}$ cm$^{-3}$. The implanted phosphorus ions are thermally driven at 1150° for 10 hours. Phosphorus ions are added to the sections $Lp_2$ and $Lp_3$ at the dose amount that will produce, after heat treatment, a surface phosphorus concentration in the sections $Lp_2$ and $Lp_3$ of about $3.0\times10^{16}$ cm$^{-3}$. And phosphorus ions are added to the section $Lp_3$ at a dose amount that, after heat treatment, will produce a surface phosphorus concentration in section $Lp_3$ of about $3.6\times10^{16}$ cm$^{-3}$. Then, to form p-type diffusion region 169, boron ions are doped into the region that includes the sections $Lp_1$, $Lp_2$ and $Lp_3$ at a dose amount that, after heat treatment, will produce a surface boron concentration of the region 169 of about $5\times10^{16}$ cm$^{-3}$. The doped boron ions are driven thermally.

The surface concentration of p-type base region 153 is about $3\times10^{16}$ cm$^{-3}$. The diffusion depth of p-type base region 153 is about 2 micrometers. The threshold voltage of the power MOSFET is set by the surface concentration in p-type base region 153. Then, a thermally oxidized film 160 of 0.6 micrometer in thickness is formed. A polysilicon gate electrode 157 is formed on a gate oxide film 163 (insulation) of 25 nm in thickness. Although not shown in FIG. 15, n$^+$-type contact regions are formed in an n-type source region 155 and an n-type drain region 154. The diffusion depth of each n$^+$-type contact region is about 0.2 micrometers. The surface concentration in each n$^+$-type contact region is $1\times10^{20}$ cm$^{-3}$. A p$^+$-type contact region 156 is in the surface portion of p-type base region 153. The surface concentration of p$^+$-type contact region 156 is $5\times10^{19}$ cm$^{-1}$. The diffusion depth of p$^+$-type contact region 156 is 0.5 micrometer.

Various alternative methods may be employed to provide p-type diffusion region 169 with impurity concentration variations. The number of diffusion sub-regions in p-type diffusion region 169 is not limited to three. The number of sub-regions in p-type diffusion region 159 depends on the breakdown voltage class, the oxide film thickness, the state of mounting, the circumstances in which the device is used, and other such conditions.

The semiconductor device according to the fourth embodiment exhibits the same effects that the semiconductor device according to the third embodiment does. However, for forming a diffusion region including a plurality of sub-regions having impurity concentrations that differ from each other, it is necessary to prepare multiple sheets of photomasks. The number of sheets will be as many as the number of sub-regions desired. For forming diffusion regions in which the conductivity types differ from each other, it is also necessary in the foregoing manufacturing methods to prepare multiple sheets of photomasks. The necessity of preparing multiple sheets of photomasks greatly increases manufacturing costs. In the following, improved methods that obviate the problem described above will be described.

The improved methods of the invention will now be described. The improved methods use one photomask to form a plurality of sub-regions, in which the impurity concentrations differ from each other, or to form a number of diffusion regions, in which the conductivity types differ from each other.

One of the improved methods uses, as a mask for ion implantation, a thin film formed of multiple layers, in which the materials and the etching speed differ from each other. The uppermost layer of the mask is machined using a photomask, and the lower layers are machined one after another. An opening is formed through each layer of the mask for ion implantation by self-alignment, so that each lower layer of the mask has a wider opening than the adjacent upper layer. Using the mask formed as described, sub-regions having differing amounts of implanted ion amounts are formed within an impurity diffusion region through a one-step ion implantation process.

Alternatively, a mask for implanting ions of different conductivity types can be formed by self-alignment using a photomask, and impurity diffusion regions having conductivity types that differ from each other, can be formed using the mask formed as described above. Here, the word "self-alignment" means that a plurality of similar patterns is formed using a single photomask.

Figure 16A:
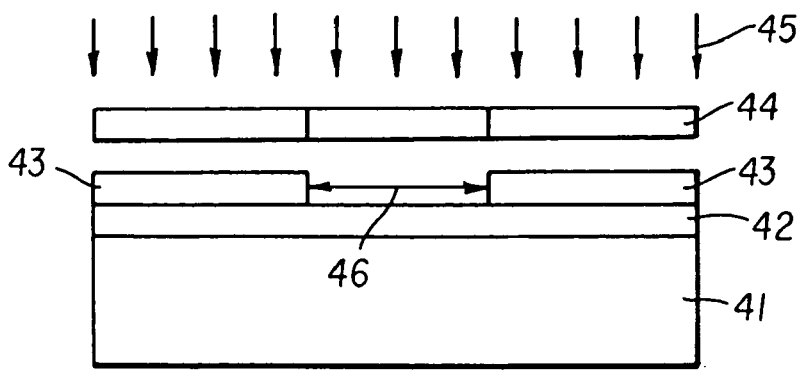
FIGS. 16(a) through 16(e) are cross-sectional views for explaining the steps of forming an impurity diffusion region, including a plurality of sub-regions in which the impurity concentrations differ from each other.
Figure 16B:
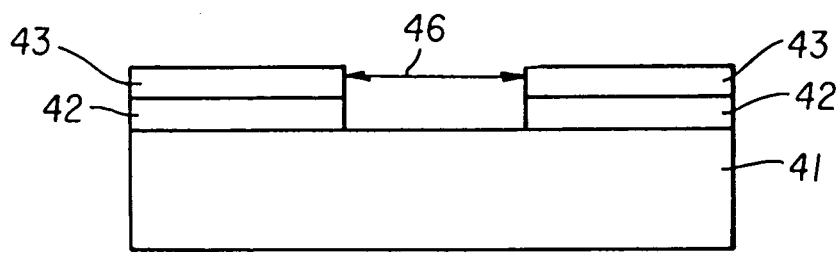
Figure 16C:
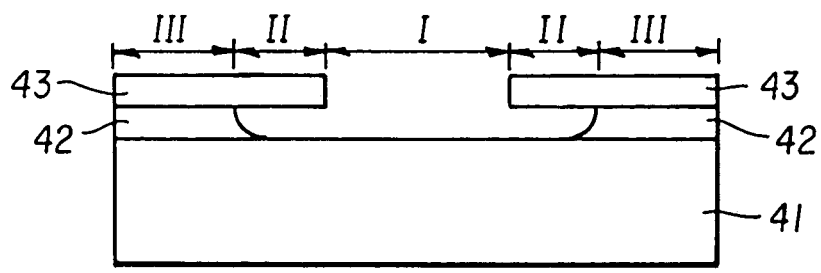
Figure 16D:
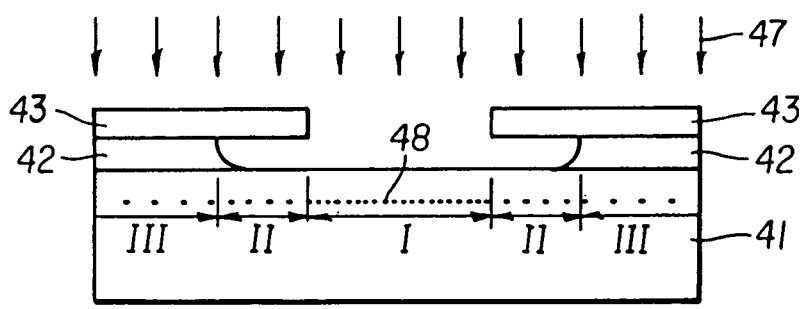
Figure 16E:
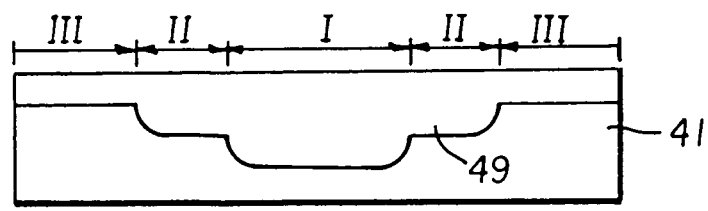
Figure 17A:
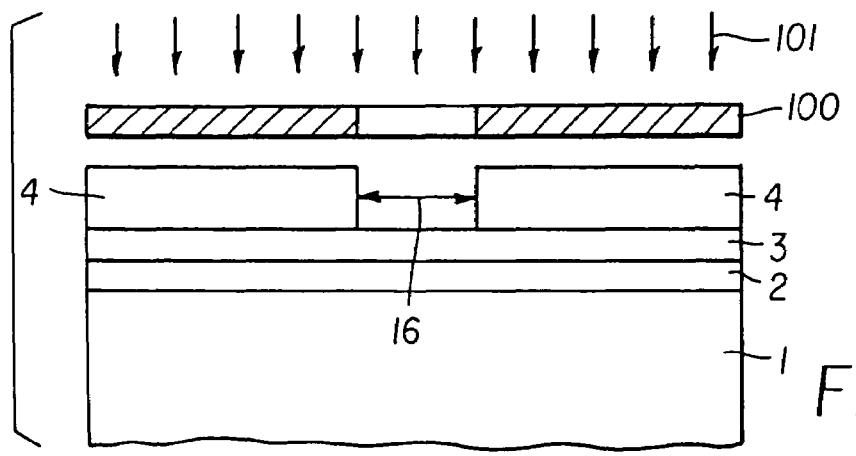
FIGS. 17(a) through 17(e) are cross-sectional views for explaining the steps of forming an impurity diffusion region, including a plurality of sub-regions in which the impurity concentrations differ from each other, according to the fifth embodiment of the invention.
Figure 17B:
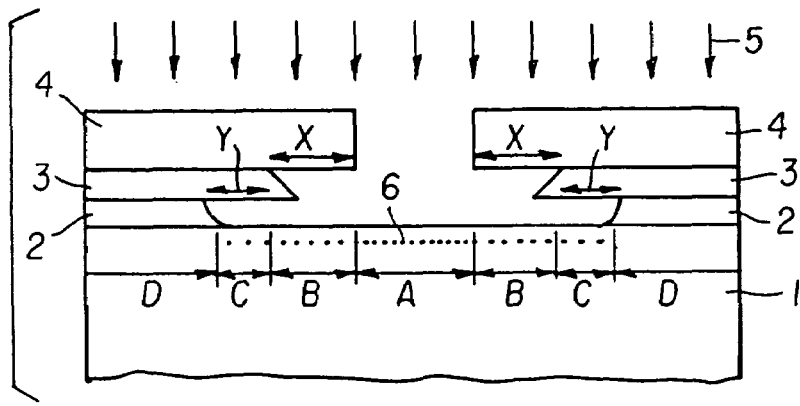
Figure 17C:
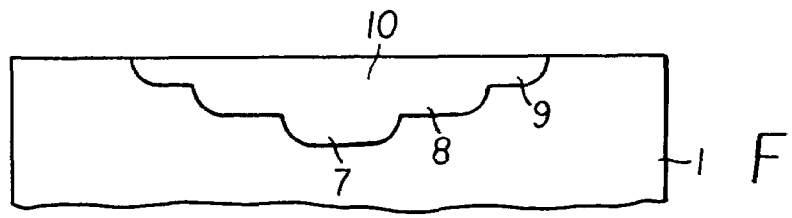
Figure 17D:
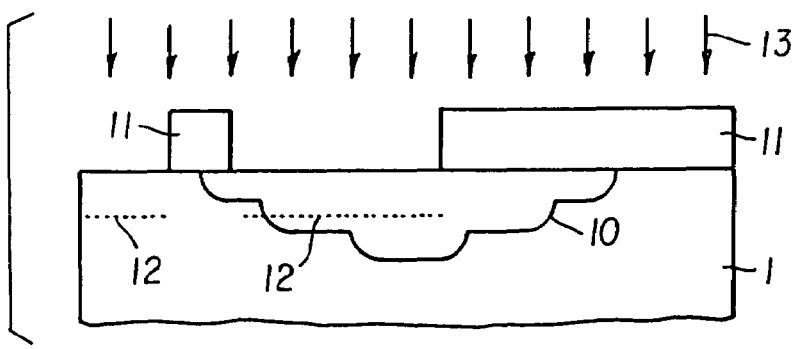
Figure 17E:
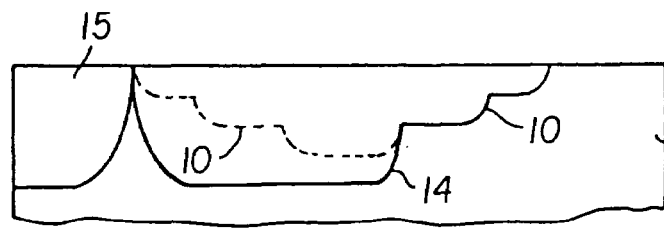

FIGS. 16(a) through 16(e) are cross-sectional views for explaining the steps of forming an impurity diffusion region that includes a plurality of sub-regions in which the impurity concentrations differ from each other. Referring now to FIG. 16(a), an SiO$_2$ film 42 is formed on a silicon substrate 41. A photoresist 43 is coated on SiO$_2$ film 42. After photoresist 43 is cured, an ultraviolet ray 45 is irradiated onto photoresist 43 through a photomask 44. An opening 46 is formed in the section of photoresist 43 corresponding to the section in which an impurity diffusion region is to be formed, by light exposure and by subsequent etching. Referring to FIG. 16(*b*), the portion of $SiO_2$ film 42 beneath opening 46 of photoresist 43 is removed by dry etching.

Referring to FIG. 16(*c*), $SiO_2$ film 42 below photoresist 43 is removed laterally with hydrofluoric acid for an intended width II (the section II in FIG. 16(*c*)). Thus, section I, indicating silicon substrate 41, is exposed; section II is covered with photoresist 43; and section III is covered with $SiO_2$ film 42 and photoresist 43. However sections I, II and III are all formed by self-alignment using a single photomask 44.

Referring now to FIG. 16(*d*), boron ion implantation 47 is directed onto the entire surface of silicon substrate 41. Since the ion-implantation blocking capabilities of sections I, II and III are different from each other, the implanted amounts of ions 48 in the sections I, II and II also differ from each other. More specifically, the following relational expression holds for the implanted ion amounts in the sections I, II and II:

The implanted ion amount in section I>
the implanted ion amount in section II>
the implanted ion amount in section III.

Referring to FIG. 16(*e*), photoresist 43 is removed, and the implanted ions are driven thermally, resulting in a p-type region 49. The resulting p-type region 49 includes continuous impurity diffusion sub-regions having the impurity concentrations that differ from each other. Since the ranges of the ions are different from sub-region to sub-region, the diffusion depths of the sub-regions are a little bit different from each other. The depths of the sub-regions are exaggerated in FIG. 16(*e*).

Now (1) a method of forming an impurity diffusion region including a plurality of sub-regions, in which the impurity concentrations differ from each other, using a single photomask; and (2) a method of forming a plurality of impurity diffusion regions, in which the conductivity types differ from each other, using a single photomask, will be described in connection with respective embodiments.

FIGS. 17(*a*) through 17(*e*) are cross-sectional views illustrating the steps of forming an impurity diffusion region including a plurality of sub-regions, in which the impurity concentrations differ from each other, according to a fifth embodiment of the invention. The method described with reference to FIGS. 17(*a*) through 17(*e*) uses a photomask 100 to form a p-type offset region 10 formed by three p-type sub-regions 7, 8 and 9.

Referring to FIG. 17(*a*), an LTO—$SiO_2$ film 2 (an $SiO_2$ film formed by low temperature oxidation) of 1 micrometer in thickness is formed on an n-type silicon substrate 1. A plasma SiN film 3 (silicon nitride film formed by the plasma CVD method) of 1 micrometer in thickness is formed on LTO—$SiO_2$ film 2. A photoresist 4 of 1 micrometer in thickness is coated on plasma SiN film 3. Photoresist 4 is cured, and an ultraviolet ray 101 is irradiated through a photomask 100 onto photoresist 4. After exposing photoresist 4 to light, an opening 16 is formed by etching the portion of photoresist 4 corresponding to the portion in which a diffusion region will be formed.

Referring to FIG. 17(*b*), the portion of plasma SiN film 3 below opening 16 of photoresist 4 is removed by dry etching. Although not shown in the figures, SiN film 3 has a binary layer structure having an upper layer of around 5 nm in thickness, and the etching speed thereof is relatively fast. This upper layer exhibiting a high etching speed is formed by modifying the surface of SiN film 3. The surface of SiN film 3 is modified by exposing the surface of SiN film 3 to hydrogen plasma. Alternatively, the upper layer of SiN film 3 is formed by depositing a thin plasma CVD-SiN:H film (silicon nitride film containing a small amount of hydrogen formed by the plasma CVD method) on a thermally nitrogenized silicon film. Due to the upper layer exhibiting a high etching speed, SiN film 3 is etched laterally for a certain width X. The etching plane of SiN film 3 is tapered, as shown in FIG. 17(*b*). The lateral width X is adjusted by prolonging the etching period of time past the amount of time needed to etch SiN film 3 to achieve the desired thickness or depth.

LTO—$SiO_2$ film 2 is not etched by the dry etching described above. The substrate 1 is dipped in hydrofluoric acid, and LTO—$SiO_2$ film 2 is etched for a certain lateral width Y from the edge of the opening of plasma SiN film 3 by wet etching. Then, boron ion implantation 5 onto the entire surface of silicon substrate 1 is performed through the mask formed of photoresist 4, plasma SiN film 3, and LTO—$SiO_2$ film 2. The concentration of the implanted boron ions 6 is the highest in the region A of silicon substrate 1 below opening 16 of photoresist 4. The concentration of implanted boron ions 6 is intermediate in the region B of silicon substrate 1 below photoresist 4. The concentration of implanted boron ions 6 is the lowest in the region C of silicon substrate 1 below the binary layered mask formed of photoresist 4 and plasma SiN film 3. The concentration of the implanted boron ions 6 is zero in the region D of silicon substrate 1 below the ternary layered mask formed of photoresist 4, plasma SiN film 3, and LTO—$SiO_2$ film 2, since the ternary layered mask completely blocks the boron ions. However, if the ternary layered mask is thin enough, some implanted boron ions 6 may be placed in the region D.

Referring to FIG. 17(*c*), the ternary mask for ion implantation including photoresist 4, plasma SiN film 3, and LTO—$SiO_2$ film 2 is removed, and the implanted boron ions 6 are driven thermally. As a result of this thermal driving step, the regions A, B and C are turned into a first p-type sub-region 7, a second p-type sub-region 8, and a third p-type sub-region 9, respectively. The boron concentration is the highest in the first p-type sub-region 7, intermediate in the second p-type sub-region 8, and the lowest in the third p-type sub-region 9. The first p-type sub-region 7, the second p-type sub-region 8 continuous to the first p-type sub-region 7, and the third p-type sub-region 9 continuous to the second p-type sub-region 8, taken together, constitute a p-type region 10. Since the ranges of the ions are different from sub-region to sub-region, the diffusion depths of the sub-regions are also a little bit different from each other. The depths of the sub-regions are exaggerated for purposes of illustration in FIG. 17(*c*).

Referring now to FIG. 17(*d*), a p-type base region and a part of the p-type offset region are formed by boron ion implantation 13 using a patterned photoresist 11 as a mask. The dose amount of boron ions 12 is set more than around the boron dose amount used in the foregoing region A.

Referring to FIG. 17(*e*), p-type regions 14 and 15 are formed by thermally driving the boron ions 12. The p-type region 15 is used for a p-type base region as one constituent element of the semiconductor device. The p-type region 14 and the first through third sub-regions 7 through 9 constitute a p-type offset region with varying impurity concentrations. Although the descriptions of the succeeding manufacturing steps are omitted, a semiconductor device the same as the semiconductor device of FIG. 1 is finally obtained using techniques known to those of ordinary skill in the art. Thus, an impurity diffusion region including a plurality of sub-regions (sub-regions 7, 8 and 9), which have impurity concentrations that differ from each other, is formed using a single photomask 100.

FIGS. 18(a) through 18(d) are cross-sectional views illustrating the steps of forming a plurality of impurity diffusion regions, which have conductivity types differing from each other, according to a sixth embodiment of the invention. The method described with reference to FIGS. 18(a) through 18(d) uses a photomask to form two diffusion regions, in which the conductivity types differ from each other.

Figure 18A:
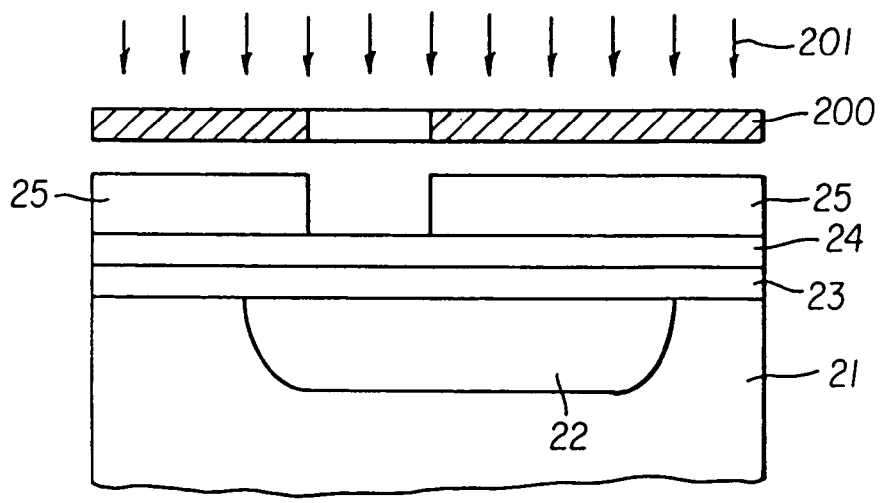
FIGS. 18(a) through 18(d) are cross-sectional views for explaining the steps of forming a plurality of impurity diffusion regions, in which the conductivity types differ from each other, according to the sixth embodiment of the invention.

Referring now to FIG. 18(a), a thermally oxidized silicon film (hereinafter referred to as an "SiO$_2$ film") 23 of 20 nm in thickness and, then, a thermally nitrogenized silicon film (hereinafter referred to as an "SiN film") 24 of 20 nm in thickness are deposited on an n-type silicon substrate 21, which covers p-type region 22. A photoresist 25 is coated on SiN film 24 and, then, photoresist 25 is cured. Photoresist 25 is patterned by irradiating an ultraviolet ray 201 through a photomask 200, such that photoresist 25 has a window in the portion thereof corresponding to the portion of n-type silicon substrate 21 in which a diffusion region is to be formed. Similarly as the foregoing SiN film 3, SiN film 24 has a binary layer structure having an upper layer of around 5 nm in thickness, in which the etching speed is fast. Due to the binary layer structure, SiN film 24 below photoresist 25 is etched laterally by plasma etching through the window of photoresist 25. The lateral etching width X is adjusted by controlling the period of time over which the over-etching is allowed to occur.

Figure 18B:
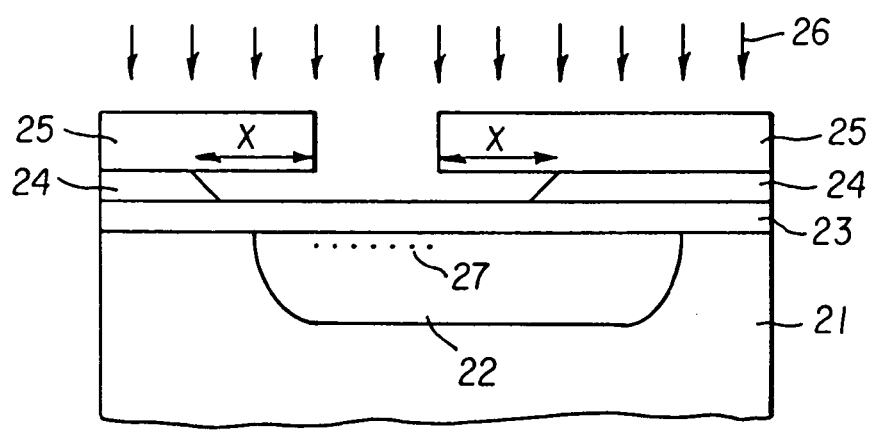
Figure 18C:
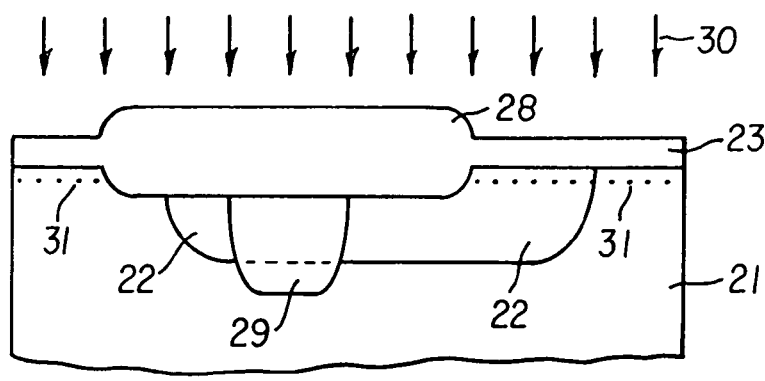

Referring to FIG. 18(b), boron ion implantation 26 is conducted to implant boron ions 27 in the portion of silicon substrate 21 below the window of photoresist 25. Referring to FIG. 18(c), photoresist 25 is removed. A p$^+$-type region 29 is formed by thermally driving the implanted boron ions 27 in an oxidizing atmosphere. At the same time, a thick oxide film 28 of around 1 micrometer in thickness (hereinafter referred to as a "LOCOS film") is formed in the portion of SiO$_2$ film 23 not covered by SiN film 24.

Figure 18D:
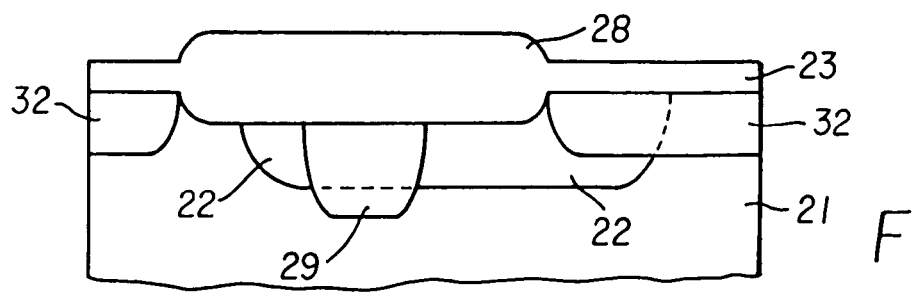

Referring to FIG. 18(d), LOCOS film 28 functions as a mask for the succeeding impurity ion implantation. By phosphorus ion implantation 30, phosphorus ions 31 of the opposite conductivity type are implanted in the portion not covered by LOCOS film 28. An n$^+$-type region 32 is formed by the succeeding thermal drive. In short, diffusion regions 29 and 32, which have conductivity types opposite to each other, are formed through the above described steps using only a single photomask 200. Thus, impurity diffusion regions, which have conductivity types that differ from each other, are formed using only one photomask.

As described above, the semiconductor device according to the invention, which includes an offset region including a plurality of impurity diffusion sub-regions, in which the impurity concentrations differ from each other, facilitates the stabilization of the breakdown voltage thereof. The manufacturing method according to the invention, which uses only one photomask for forming an impurity diffusion region including a plurality of sub-regions, which have impurity concentrations for forming a plurality of different impurity diffusion regions, and/or which have conductivity types differing from each other, facilitates the reduction of manufacturing costs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device exhibiting a high breakdown voltage, the method comprising the steps of:
    selectively forming a second region of a second conductivity type and a third region of a first conductivity type in the surface portion of a first region of the first conductivity type, the second region and the third region being spaced apart from each other;
    selectively forming a fourth region of the first conductivity type in the surface portion of the second region;
    selectively forming a fifth region of the second conductivity type in the surface portion of the first region between the second region and the third region;
    forming a first insulation film on the fifth region;
    forming a gate electrode above the extended portion of the second region extending between the fourth region and the first region, with a gate insulation film interposed between the extended portion of the second region and the gate electrode;
    forming a first main electrode on the fourth region; and
    forming a second main electrode on the third region;
    wherein the step of selectively forming the fifth region comprises:
    (1) introducing a predetermined amount of an impurity of the second conductivity type in the portion of the first region in which it is intended to form the fifth region;
    (2) dividing the intended portion of the first region into a plurality of sub-regions;
    (3) adding a further amount of the impurity of the second conductivity type to the sub-region nearer to the second region; and
    (4) thermally driving the impurity in the sub-regions collectively.

2. The method according to claim 1, the method further comprising the step of extending the gate electrode onto the first insulation film.

3. The method according to claim 1, the method further comprising the step of selectively forming the first region in the surface portion of a semiconductor substrate of the second conductivity type.

4. A method of manufacturing a semiconductor device exhibiting a high breakdown voltage, the method comprising the steps of:
    selectively forming a second region of a second conductivity type and a third region of a first conductivity type in the surface portion of a first region of the first conductivity type, the second region and the third region being spaced apart from each other;
    selectively forming a fourth region of the first conductivity type in the surface portion of the second region;
    selectively forming a fifth region of the second conductivity type in the surface portion of the first region between the second region and the third region;
    forming a first insulation film on the fifth region;
    forming a gate electrode above the extended portion of the second region extending between the fourth region and the first region, with a gate insulation film interposed between the extended portion of the second region and the gate electrode;
    forming a first main electrode on the fourth region; and
    forming a second main electrode on the third region;

wherein the step of selectively forming the fifth region comprises:

(1) introducing a predetermined amount of an impurity of the second conductivity type in the portion of the first region in which it is intended to form the fifth region;

(2) dividing the intended portion of the first region into a plurality of sub-regions;

(3) adding a further amount of the impurity of the second conductivity type to the sub-region nearer to the second region;

(4) introducing a further amount of an impurity of the first conductivity type to the sub-region nearer to the third region, the amount of the impurity of the first conductivity type being less than the predetermined amount of the impurity of the second conductivity type; and (5) thermally driving the impurities in the sub-regions collectively.

5. The method according to claim 4, the method further comprising the step of extending the gate electrode onto the first insulation film.

6. The method according to claim 4, the method further comprising the step of selectively forming the first region in the surface portion of a semiconductor substrate of the second conductivity type.

7. A method of manufacturing a semiconductor device exhibiting a high breakdown voltage, the method comprising the steps of:

selectively forming a second region of a second conductivity type and a third region of a first conductivity type in the surface portion of a first region of the first conductivity type, the second region and the third region being spaced apart from each other;

selectively forming a fourth region of the first conductivity type in the surface portion of the second region;

selectively forming a fifth region of the second conductivity type in the surface portion of the first region between the second region and the third region;

forming a first insulation film on the fifth region;

forming a gate electrode above the extended portion of the second region extending between the fourth region and the first region, with a gate insulation film interposed between the extended portion of the second region and the gate electrode;

forming a first main electrode on the fourth region; and forming a second main electrode on the third region;

wherein the step of selectively forming the fifth region comprises:

(1) dividing into a plurality of sub-regions that portion of the first region in which the fifth region is intended to be formed;

(2) introducing a further amount of an impurity of the first conductivity type to the sub-region nearer to the third region;

(3) introducing a predetermined amount of an impurity of the second conductivity type to the sub-regions, the predetermined amount of the impurity of the second conductivity type being more than the amount of the impurity of the first conductivity type; and (4) thermally driving the impurities in the sub-regions collectively.

8. The method according to claim 7, the method further comprising the step of extending the gate electrode onto the first insulation film.

9. The method according to claim 7, the method further comprising the step of selectively forming the first region in the surface portion of a semiconductor substrate of the second conductivity type.

* * * * *